US009252306B2

(12) United States Patent
Goto et al.

(10) Patent No.: US 9,252,306 B2
(45) Date of Patent: Feb. 2, 2016

(54) MULTILAYER THIN-FILM PHOTOELECTRIC CONVERTER AND ITS MANUFACTURING METHOD

(75) Inventors: Masahiro Goto, Otsu (JP); Wataru Yoshida, Otsu (JP); Toshiaki Sasaki, Otsu (JP)

(73) Assignee: KANEKA CORPORATION, Osaka (JP)

( * ) Notice: Subject to any disclaimer, the term of this patent is extended or adjusted under 35 U.S.C. 154(b) by 976 days.

(21) Appl. No.: 12/746,486

(22) PCT Filed: Dec. 5, 2008

(86) PCT No.: PCT/JP2008/072126
§ 371 (c)(1),
(2), (4) Date: Jun. 30, 2010

(87) PCT Pub. No.: WO2009/072592
PCT Pub. Date: Jun. 11, 2009

(65) Prior Publication Data
US 2010/0282291 A1    Nov. 11, 2010

(30) Foreign Application Priority Data
Dec. 5, 2007  (JP) ................................. 2007-314802

(51) Int. Cl.
*H01L 31/0224*  (2006.01)
*H01L 31/0392*  (2006.01)
(Continued)

(52) U.S. Cl.
CPC .. *H01L 31/03921* (2013.01); *H01L 31/022425* (2013.01); *H01L 31/022466* (2013.01); *H01L 31/046* (2014.12); *H01L 31/1884* (2013.01); *Y02E 10/50* (2013.01)

(58) Field of Classification Search
CPC ..... Y02E 10/50; Y02E 10/547; Y02E 10/546; Y02E 10/548; H01L 27/1423; H01L 27/1425; H01L 31/022425; H01L 31/18; H01L 31/068; H01L 31/1804; H01L 31/1896; H01L 31/02008; H01L 31/182; H01L 31/042; H01L 31/05; H01L 31/0504; H01L 31/022466; H01L 31/046; H01L 31/03921; H01L 31/076; H01L 31/0463; H01L 31/1884

USPC ................ 136/256, 244, 251, 252, 255, 259; 438/57, 71, 98
See application file for complete search history.

(56) References Cited

U.S. PATENT DOCUMENTS

| | | | | |
|---|---|---|---|---|
| 6,252,157 | B1 * | 6/2001 | Nishio | 136/257 |
| 2009/0107538 | A1 * | 4/2009 | Luch | 136/244 |
| 2010/0116332 | A1 * | 5/2010 | Counil et al. | 136/256 |

FOREIGN PATENT DOCUMENTS

| | | |
|---|---|---|
| JP | 3091267 | 4/1991 |
| JP | 5021822 | 1/1993 |

(Continued)

OTHER PUBLICATIONS

ISA The International Bureau of WIPO, International Preliminary Report on Patentability for International Application No. PCT/JP2008/072126, Aug. 19, 2010, 5 pages.
(Continued)

*Primary Examiner* — Jayne Mershon
*Assistant Examiner* — Mayla Gonzalez Ramos
(74) *Attorney, Agent, or Firm* — Alleman Hall McCoy Russell & Tuttle LLP

(57) ABSTRACT

A thin film photoelectric converter including a transparent conductive layer, a laser light absorption layer, a back electrode layer, a semiconductor photoelectric conversion layer and a transparent electrode layer stacked on a translucent substrate. The laser light absorption layer is parted into regions by first kind parting line grooves, and the photoelectric conversion layer is parted into regions by third kind parting line grooves penetrating the laser light absorption layer, the rear surface electrode layer and the photoelectric conversion layer. The transparent electrode layer is parted into regions by fourth kind parting line grooves penetrating the laser light absorption layer, the rear surface electrode layer, the photoelectric conversion layer and the transparent electrode layer. A receiving side transparent electrode region of one cell is electrically connected to a back electrode region of an adjacent cell through the first kind groove, the transparent conductive layer and the third kind groove.

25 Claims, 10 Drawing Sheets

(51) Int. Cl.
*H01L 31/046* (2014.01)
*H01L 31/18* (2006.01)

(56) References Cited

FOREIGN PATENT DOCUMENTS

| JP | 7335924 | | 12/1995 |
| JP | 07335924 | A * | 12/1995 |
| JP | 10079522 | | 3/1998 |
| JP | 10079522 | A * | 3/1998 |
| JP | 11186573 | A * | 7/1999 |
| JP | 2001203374 | A | 7/2001 |
| JP | 2002261308 | | 9/2002 |
| JP | 2003124485 | | 4/2003 |
| JP | 2003124485 | A * | 4/2003 |
| JP | 2003273383 | | 9/2003 |
| JP | 2004103959 | | 4/2004 |
| JP | 2005244073 | A | 9/2005 |
| JP | 2006313872 | | 11/2006 |

OTHER PUBLICATIONS

ISA Japan, International Search Report PCT/JP2008/072126, Jan. 13, 2009, 2 pages.

* cited by examiner

MULTILAYER THIN-FILM PHOTOELECTRIC CONVERTER AND ITS MANUFACTURING METHOD

TECHNICAL FIELD

The present invention relates to an improvement in an integrated-type thin film photoelectric converter, in which a thin film photoelectric conversion layer on a substrate is parted into a plurality of cells and those cells are electrically connected in series, and manufacturing method thereof.

BACKGROUND ART

In recent years, there has been diversification of a thin film solar cell as a typical example of a thin film photoelectric converter, having led to development of a crystalline thin film solar cell in addition to a conventional amorphous thin film solar cell, and also to commercial application of a hybrid (a kind of stacked) thin film solar cell, in which these cells are stacked.

Normally, the thin film solar cell includes a transparent conductive film, one or more semiconductor thin film photoelectric conversion units, and a back electrode layer sequentially stacked on a substrate having an insulating property at least in its surface. One photoelectric conversion unit includes an i-type layer sandwiched between a p-type layer and an n-type layer.

The i-type layer as a substantially intrinsic semiconductor layer accounts for a large fraction of a thickness of the photoelectric conversion unit, and a photoelectric conversion effect occurs mainly inside this i-type layer. Therefore, a film thickness of the i-type layer as the photoelectric conversion layer is preferably large for light absorption, but when the i-type layer is made thicker than necessary, the time and cost for its deposition increase.

Meanwhile, the p-type and n-type conductive layers each serve to generate a diffusion potential inside the photoelectric conversion unit, and a level of this diffusion potential influences a value of an open circuit voltage, which is one of the important characteristics of the thin film solar cell. However, these conductive layers are inactive layers and thus do not contribute to photoelectric conversion, and light absorbed by impurities having been doped into the conductive layer does not contribute to power generation and is lost. It is thus preferable to make the film thicknesses of the p-type and n-type conductive layers as small as possible within the range that sufficiently generates the diffusion potential.

With respect to the photoelectric conversion units as described above, a unit with an amorphous i-type photoelectric conversion layer is called an amorphous photoelectric conversion unit and a unit with a crystalline i-type photoelectric conversion layer is called a crystalline photoelectric conversion unit, regardless of whether the p-type and n-type conductive layers included therein are amorphous or crystalline. An example of a thin film solar cell including the amorphous photoelectric conversion unit is an amorphous thin film silicon solar cell using amorphous silicon for the i-type photoelectric conversion layer. Further, an example of a thin film solar cell including the crystalline photoelectric conversion unit is a crystalline thin film silicon solar cell using microcrystalline silicon or polycrystalline silicon for the i-type photoelectric conversion layer.

Generally, in a semiconductor for use in the photoelectric conversion layer, a light absorption coefficient becomes smaller with increase in wavelength of light. Especially in the case of the photoelectric conversion material being a thin film, since sufficient light absorption does not occur in a wavelength region with a small absorption coefficient, an amount of photoelectric conversion is restricted due to the thickness of the photoelectric conversion layer. Therefore, an innovation has been made to form a light-scattering structure in which light incident inside the photoelectric converter resists escaping outside, making a practical light path length larger for sufficient absorption, and thereby generating a large photocurrent. For example, a texture transparent conductive film with uneven shaped surface has been used so that light transmission scattering occurs.

Incidentally, a thin film photoelectric converter having a large area is typically formed as an integrated-type thin film photoelectric conversion module. In other words, the integrated-type thin film photoelectric conversion module has a structure in which a plurality of photoelectric conversion cells, having been parted into small areas on a support substrate, are electrically connected in series. Each of the photoelectric conversion cells is usually formed by sequentially performing formation of a first electrode layer, one or more semiconductor thin film photoelectric conversion unit and a second electrode layer, and patterning by a laser beam.

In other words, in manufacturing an integrated-type thin film photoelectric converter, a processing technique using a laser beam has an important influence upon productivity and photoelectric conversion performance of the photoelectric converter. Generally, in this laser beam processing technique, it is easy to perform processing of parting a semiconductor photoelectric conversion layer that is apt to absorb a laser light into a plurality of regions. On the other hand, as for a metal layer that reflects a laser light or a transparent conductive layer that is apt to transmit a laser light therethrough, it is not easy to perform processing of parting each of those layers independently.

FIG. 6 illustrates a schematic sectional view of a method for producing an integrated-type thin film photoelectric converter disclosed in Patent Document 1. It is to be noted that in drawings of the present application, like reference numerals denote like or corresponding portions. Further, in the drawings of the present applications, relations of dimensions, such as lengths, widths and thicknesses, are appropriately changed for the sake of clarification as well as simplification of the drawings, and actual dimensional relations are not shown. In particular, the relation of thicknesses is appropriately changed and drawn.

In FIG. 6(a), at the first setout, a transparent tin oxide layer 2, a laser light absorption layer 3 and a back electrode layer 4 are sequentially stacked on a transparent glass substrate 1. The transparent tin oxide layer 2 can be deposited by thermal CVD method. Such a transparent tin oxide layer 2 has a textured surface structure with fine unevenness, which influences a surface structure of the back electrode layer 4, in order to improve light absorption efficiency inside the semiconductor photoelectric conversion layer by diffuse light reflection from the surface of the back electrode layer. As the laser light absorption layer 3, an amorphous silicon (a-Si) layer is deposited by a plasma CVD method. As the back electrode layer 4, an Ag layer is deposited using a magnetron sputtering device.

In FIG. 6(b), the substrate taken out of a sputtering reaction chamber is set on an X-Y table, and a plurality of parting line grooves D1 are formed by use of a laser beam LB1 incident from the transparent glass substrate 1 side so that the stack of the transparent tin oxide layer 2, the laser light absorption layer 3 and the metal back electrode layer 4 is parted into a plurality of regions. Since the laser beam LB1 is efficiently absorbed by the laser light absorption layer 3 through the transparent glass substrate 1 and the transparent tin oxide layer 2 to generate heat, the transparent tin oxide layer 2 and the back electrode layer 4 can be simultaneously subjected to parting processing with relative ease. The plurality of parting line grooves D1 as thus formed are mutually in parallel, and extending in a direction orthogonal to the surface of the figure.

In FIG. 6(c), a semiconductor photoelectric conversion layer 5 is deposited using a plasma CVD device so as to cover the parted back electrode layer 4 and the parting line grooves D1.

In FIG. 6(d), the substrate taken out of a plasma CVD reflection chamber is set on the X-Y table, and a plurality of parting line grooves D2 are formed by use of a YAG laser beam LB2 incident from the semiconductor photoelectric conversion layer 5 side thereby part the semiconductor photoelectric conversion layer 5 into a plurality of photoelectric conversion regions. Each of these parting line grooves D2 is proximal to and in parallel with each of the parting line grooves D1.

In FIG. 6(e), a light receiving side transparent electrode layer 6 is deposited so as to cover the parted semiconductor photoelectric conversion layer 5 and the parting line grooves D2. This light receiving side transparent electrode layer 6 can be formed by depositing an ITO (indium tin oxide) layer inside an electron-beam vapor deposition device.

Finally, in FIG. 6(f), the substrate taken out of the electron-beam vapor deposition device is set on the X-Y table, and a plurality of parting line grooves D3 are formed by use of the YAG laser beam LB3 incident from the light receiving side transparent electrode layer 6 side to part the light receiving side transparent electrode layer 6 into a plurality of regions. In this case, although the light receiving side electrode layer 6 is transparent, since the semiconductor photoelectric conversion layer 5 being apt to absorb a laser light is present under the light receiving side transparent electrode layer, heat generated inside the semiconductor photoelectric conversion layer 5 can also be used to perform processing of parting the light receiving side transparent electrode layer 6 with relative ease. In such a manner, the integrated-type thin film photoelectric converter is completed.

Patent Document 1: Japanese Patent Application Laid-Open No. H10-79522

DISCLOSURE OF THE INVENTION

Problems to be Solved by the Invention

According to the above-mentioned Patent Document 1, as in FIG. 6(b), since the laser beam LB1 is efficiently absorbed by the laser light absorption layer 3 through the transparent glass substrate 1 and the transparent tin oxide layer 2 to generate heat, the transparent tin oxide layer 2 and the metal back electrode layer 4 can be simultaneously parted with relative ease to form the parting line grooves D1.

Further, as in FIG. 6(d), since the laser beam LB2 is incident from the semiconductor photoelectric conversion layer 5 side, the semiconductor photoelectric conversion layer 5 can be parted to form the parting line grooves D2 with relative ease. However, the back electrode layer 4 may be damaged by heat generation from the semiconductor photoelectric conversion layer 5 or the laser beam LB2 having reached the back electrode layer 4 inside the parting line grooves D2. In that case, in the thin film photoelectric converter after completion, a decrease in shunt resistance or an increase in series resistance may occur to cause deterioration in photoelectric conversion performance.

Moreover, as in FIG. 6(f), since the semiconductor photoelectric conversion layer 5 is irradiated with the laser beam LB3 through the light receiving side transparent electrode layer 6, heat generated inside the semiconductor photoelectric conversion layer 5 can also be used to part the light receiving side transparent electrode layer 6 with relative ease so as to form the parting line grooves D3. However, it is difficult to set a depth of the parting line grooves D3 to halfway through the semiconductor photoelectric conversion layer 5. Therefore, as in the case of the parting line grooves D2, also inside the parting line grooves D3, the back electrode layer 4 may be damaged by heat generation from the semiconductor photoelectric conversion layer 5 or a laser beam LB3 that reaches the back electrode layer 4. As a result, in an end product of the thin film photoelectric converter, a decrease in shunt resistance or an increase in series resistance may occur to cause deterioration in photoelectric conversion performance.

In order to avoid the above-mentioned problems in Patent Document 1, a high stability of laser power, a high accuracy in irradiation position and the like are required, necessitating a highly accurate laser oscillator as well as a complex optical system. Meanwhile, in view of such difficulty in laser processing, chemical etching, a lift-off method or the like may be employed in place of laser patterning. In that case, however, it is concerned that processes may be complicated or the accuracy in parting line grooves may deteriorate. Further, when any of these methods are employed, an increase in manufacturing cost of the integrated-type thin film photoelectric converter may result.

In view of such circumstances in the prior art as described above, an object of the present invention is to provide an integrated-type thin film photoelectric converter at low cost, which is capable of forming all parting line grooves by laser processing with high productivity, and is excellent in photoelectric conversion characteristics as well as reliability.

Means for Solving the Problems

An integrated-type thin film photoelectric converter according to the present invention includes a transparent conductive layer 2, a laser light absorption layer 3, a back electrode layer 4, a semiconductor photoelectric conversion layer and a light receiving side transparent electrode layer 6, stacked sequentially on a transparent substrate 1. Each of these layers is parted into a plurality of strip photoelectric conversion cell regions by a plurality of parting line grooves which are provided in parallel and the plurality of photoelectric conversion cells are electrically connected in series.

In the photoelectric converter of the present invention, the laser light absorption layer 3 is parted into a plurality of strip regions by a plurality of first kind parting line grooves D0 which penetrate the laser light absorption layer 3. The semiconductor photoelectric conversion layer 5 is parted into a plurality of strip photoelectric conversion regions by a plurality of third kind parting line grooves D2 which penetrate the laser light absorption layer 3, the back electrode layer 4 and the semiconductor photoelectric conversion layer 5. The light receiving side transparent electrode layer 6 is parted into a plurality of strip light receiving side transparent electrode regions by a plurality of fourth kind parting line grooves D3 which penetrate the laser light absorption layer 3, the back electrode layer 4, the semiconductor photoelectric conversion layer 5 and the light receiving side transparent electrode layer 6. Between the photoelectric conversion cells which are mutually adjacent, the back electrode region of the one cell is electrically connected to the light receiving side transparent electrode region of the other cell through the first kind parting line grooves D0, the transparent conductive layer 2 and the third kind parting line grooves D2, whereby those photoelectric conversion cells are electrically connected in series.

In Embodiment 1 of the present invention, as shown in FIG. 1, the back electrode layer 4 is parted into a plurality of strip back electrode regions by a plurality of second kind parting line grooves D1 which penetrate the transparent conductive layer 2, the laser light absorption layer 3 and the back electrode layer 4.

On the other hand, in Embodiment 2 of the present invention, as shown in FIG. 3, the back electrode layer 4 is parted into a plurality of strip back electrode regions by a plurality of sixth kind parting line grooves D5 which penetrate the laser light absorption layer 3 and the back electrode layer 4. The transparent conductive layer 2 is parted into a plurality of strip light receiving side transparent conductive regions by a plurality of fifth kind parting line grooves D4 which penetrate the transparent conductive layer 2. That is, in Embodiment 1 above, the second kind parting line grooves D1 penetrate the transparent conductive layer 2, the laser light absorption layer 3 and the back electrode layer 4, whereas in Embodiment 2 of the present invention, the fifth kind parting line grooves D4, which penetrate the transparent conductive layer 2, and the sixth kind parting line grooves D5, which do not penetrate the transparent conductive layer 2 but penetrate the laser light absorption layer 3 and the back electrode layer 4, are provided in place of the second kind parting line grooves D1.

In Embodiment 2 of the present invention, from the viewpoint of the plurality of photoelectric conversion cells being electrically connected in series, each of the parting line grooves is arrayed in the order corresponding to the sixth kind parting line grooves D5, the fifth kind parting line grooves D4, the third kind parting line grooves D2, the fourth kind parting line grooves D3 and the first kind parting line grooves D0, or arrayed as shown in FIG. 3 in the order corresponding to the sixth kind parting line grooves D5, the third kind parting line grooves D2, the fourth kind parting line grooves D3, the first kind parting line grooves D0 and the fifth kind parting line grooves D4.

Further, as shown in FIGS. 7 to 11, Embodiment 2 also includes one in which the fifth kind parting line grooves D4 and the sixth kind parting line grooves D5 are connected with each other, and the parting line grooves are arrayed therefrom in the order corresponding to the third kind parting line groove D2, the fourth kind parting line groove D3, the third kind parting line groove D2, the fourth kind parting line groove D3 and the first kind parting line grooves D0. As thus described, when the fifth kind parting line grooves D4 and the sixth kind parting line grooves D5 are connected with each other, these parting line grooves become equivalent to the second kind parting line grooves D1 in Embodiment 1. In Embodiment 1, the second kind parting line grooves D1 are formed so as to penetrate the transparent conductive layer 2, the laser light absorption layer 3 and the back electrode layer 4, whereas in Embodiment 2, the fifth kind parting line grooves D4 which penetrate the transparent conductive layer 2 and the sixth kind parting line grooves D5 which penetrate the laser light absorption layer 3 and the back electrode layer 4 are separately formed. Therefore, in Embodiment 2, problems of degeneration of processed cross-sectional surface on the peripheries of the parting line grooves D4 and D5, rising of films on the peripheries of those parting line grooves due to the degeneration and the like are suppressed, so that a fill factor of the photoelectric converter may be maintained high. Configurations and examples of manufacturing of such embodiments are described in more detail in later Examples.

Further, in Embodiment 2B of the present invention, as shown in FIG. 3, each of parting line grooves is arrayed in the order corresponding to the sixth kind parting line grooves D5, the third kind parting line grooves D2, the fourth kind parting line grooves D3, the first kind parting line grooves D0 and the fifth kind parting line grooves D4. Moreover, as shown in FIG. 4, the laser light absorption layer 3 includes a pn junction or a pin junction of a semiconductor, and the pn junction or the pin junction of the laser light absorption layer 3 and a pin junction of the semiconductor photoelectric conversion layer 5 are formed such that reverse-type conductive layers are facing each other across the back electrode layer 4.

According to Embodiment 2B above, the photoelectric conversion cell regions are electrically connected in series, and the back electrode region of one photoelectric conversion cell region is electrically connected to the back electrode region of another photoelectric conversion cell region through the first kind parting line grooves D0, the transparent conductive layer 2 and the laser light absorption layer 3. Thereby, a diode region connected with the transparent conductive layer 2, the laser light absorption layer 3 and the back electrode layer 4 is formed inside each photoelectric cell region, and the diode region and the photoelectric conversion region inside the same photoelectric cell are connected so as to be electrically connected in parallel and to have reverse rectifying characteristics.

It is to be noted that the integrated-type thin film photoelectric converter according to the present invention may additionally include grid metal electrode wires 7 on the light receiving side transparent electrode layer 6, and in that case, the fourth kind parting line grooves D3 also penetrate the grid metal electrode wires 7.

In a method for manufacturing an integrated-type thin film photoelectric converter according to the present invention, it is favorable to form all of the parting line grooves by irradiation with a laser beam from the transparent substrate 1 side. When the leaser beam is irradiated from one side in such a manner, the need for reversing the front and the back of the substrate between different laser processing is eliminated. Therefore, a device and an operation for reversing the substrate are no longer necessary, and further, positioning is facilitated so as to contribute to improvement in processing accuracy.

Moreover, in formation of the parting line grooves, all of the parting line grooves are preferably formed in the state where the transparent substrate 1 is located above the transparent conductive layer 2 in a vertical direction. When the transparent substrate 1 is located above in such a manner, the irradiation with a laser beam is performed from above, and fragments generated at the time of processing each of the layers, such as the back electrode layer, are discharged outside the photoelectric converter by the laser and drops downward by gravitation, so as to be suppressed from returning to the photoelectric converter. It is thus possible to suppress deterioration in photoelectric conversion performance, such as a short circuit due to the fragments.

Further, in an embodiment of a manufacturing method according to the present invention, grooves that do not penetrate the transparent conductive layer 2, namely the first, third and fourth kinds parting line grooves D0, D2 and D3 in Embodiment 1, and the first, third, fourth and sixth kinds parting line grooves D0, D2, D3 and D5 in Embodiment 2, are formed by use of laser beams passing through the transparent conductive layer 2. In an example of such an embodiment, the laser light absorption layer 3 includes a silicon-based semiconductor, and these grooves that do not penetrate the transparent conductive layer 2 are each formed, for example, by use of a second harmonic beam of a YAG laser.

Further, in another embodiment of the manufacturing method according to the present invention, the grooves that penetrate the transparent conductive layer 2, namely the second kind parting line grooves D1 in Embodiment 1 and the fifth kind parting line grooves D4 in Embodiment 2, are each formed by use of a laser beam being absorbed into the transparent conductive layer 2. In an example of such an embodiment, the transparent conductive layer 2 includes a transparent conductive oxide, and the grooves which penetrate the transparent conductive layer 2 can be formed by use of a beam of a fundamental wave of the YAG laser.

Effects of the Invention

According to the present invention as described above, an integrated-type thin film photoelectric converter can be obtained by laser beam processing without damaging the back electrode layer, so as to significantly improve its photoelectric conversion characteristics. Further, according to the manufacturing method of the present invention, since only beam-irradiation from the substrate side is performed in laser beam processing, an integrated-type thin film photoelectric converter with improved photoelectric conversion characteristics can be obtained with high productivity at low cost.

Further, according to Embodiment 2B of the present invention, the laser light absorption layer can be used as a bypass diode by being imparted with a rectifying characteristic. The bypass diode region and the photoelectric conversion region inside the same photoelectric conversion cell are connected so as to be electrically in parallel and have reverse rectifying characteristics, whereby a highly reliable integrated-type thin film photoelectric converter, in which appearance deterioration and performance degradation due to a hot spot phenomenon are suppressed, can be obtained at low cost with ease.

Figure 1:
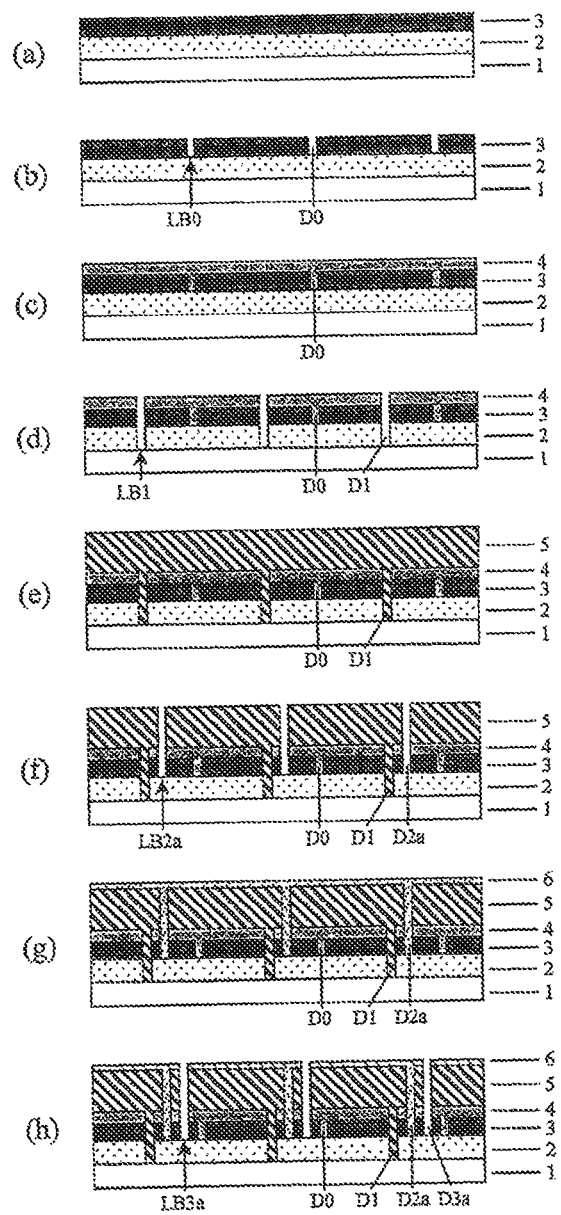
FIG. 1 is a schematic sectional view for explaining a manufacturing process of a integrated-type thin film photoelectric converter according to Embodiment 1 of the present invention.

DESCRIPTION OF REFERENCE NUMERALS 1 transparent substrate
2 transparent conductive layer
3 laser light absorption layer
4 back electrode layer
5 semiconductor photoelectric conversion layer
6 light receiving side transparent electrode layer
7 grid metal electrode wire
  LB0 to LB5 laser beam
  D0 to D5 parting line groove
  A photoelectric conversion cell region
  B photoelectric conversion function region
  C diode region

BEST MODES FOR CARRYING OUT THE INVENTION

Embodiment 1

FIG. 1 illustrates a schematic sectional view of an example of a method for producing an integrated-type thin film photoelectric converter according to Embodiment 1 of the present invention.

First, in FIG. 1(a), a transparent conductive layer 2 and a laser light absorption layer 3 are sequentially deposited on a transparent substrate 1 such as a glass. The transparent conductive layer 2 can be formed of a transparent conductive oxide (TCO) such as zinc oxide, tin oxide or indium oxide. Further, the laser light absorption layer 3 can be formed of a semiconductor such as amorphous silicon, an amorphous silicon alloy, microcrystalline silicon or polycrystalline silicon.

In FIG. 1(b), the laser light absorption layer 3 is parted into a plurality of regions by a plurality of first kind parting line grooves D0 which are formed by a laser beam LB0 incident from the transparent substrate 1 side. The plurality of the first kind parting line grooves D0 as thus formed are mutually in parallel and extending in a direction perpendicular to the surface of the figure.

In FIG. 1(c), a back electrode layer 4 is deposited so as to cover the parted laser light absorption layer 3 and the first kind parting line grooves D0. This back electrode layer 4 can be formed through use of a metal such as silver or aluminum. Further, the back electrode layer 4 preferably includes a first transparent conductive layer, a metal layer and a second transparent conductive layer sequentially stacked from the side closer to the laser light absorption layer 3. Having the transparent conductive layer in such a manner can enhance adhesive force between the back electrode layer 4 and the laser light absorption layer 3 as well as adhesive force between the back electrode layer 4 and the semiconductor photoelectric conversion layer 5, so that the photoelectric conversion characteristics are improved. As the first transparent conductive layer and the second conductive layer to form the back electrode layer 4, a material mainly containing zinc oxide is suitably used.

In FIG. 1(*d*), the transparent conductive layer 2, the laser light absorption layer 3 and the back electrode layer 4 are parted into a plurality of regions by a laser beam LB1 incident from the transparent substrate 1 side. At this time, the laser beam LB1 is absorbed into the transparent conductive layer 2 and the laser light absorption layer 3 to generate heat. With the heat generation, the back electrode layer 4 can be parted to form second kind parting line grooves D1 with relative ease. Each of the second kind plurality of parting line grooves D1 as thus formed is extending in parallel with the first kind parting line grooves D0.

In FIG. 1(*e*), a semiconductor photoelectric conversion layer 5 is deposited so as to cover the parted back electrode layer 4 and the second kind parting line grooves D1. This semiconductor photoelectric conversion layer 5 includes a semiconductor junction (not shown) in parallel with its principal surface.

In FIG. 1(*f*), the laser light absorption layer 3, the back electrode layer 4 and the semiconductor photoelectric conversion layer 5 are parted into a plurality of regions by a laser beam LB2*a* incident from the transparent substrate 1 side. At this time, the laser beam LB2*a* is absorbed into the laser light absorption layer 3 to generate heat. With the heat generation, the back electrode layer 4 and the semiconductor photoelectric conversion layer 5 can be parted with relative ease. Each of the plurality of third kind parting line grooves D2*a* as thus formed is extending in parallel with and adjacently to the second kind parting line grooves D1.

In FIG. 1(*g*), a light receiving side transparent electrode layer 6 is deposited so as to cover the parted semiconductor photoelectric conversion layer 5 and the third kind parting line grooves D2*a*.

Finally, in FIG. 1(*h*), the laser light absorption layer 3, the back electrode layer 4, the semiconductor photoelectric conversion layer 5, and the light receiving side transparent electrode layer 6 are parted into a plurality of regions by a laser beam LB3*a* incident from the transparent substrate 1 side. At this time, the laser beam LB3*a* is absorbed into the laser light absorption layer 3 to generate heat. With the heat generation, the back electrode layer 4, the semiconductor photoelectric conversion layer 5 and the light receiving side transparent electrode layer 6 can be parted with relative ease. Each of a plurality of fourth kind parting line grooves D3*a* as thus formed is extending in parallel with and adjacently to the third kind parting line grooves D2*a*.

In the manner as described above, a plurality of slim strip thin film photoelectric conversion cells are formed on one transparent substrate 1. The back electrode layer 4 of one cell is connected to the transparent conductive layer 2 through the first kind parting line grooves D0, and the light receiving side transparent electrode layer 6 is connected to the transparent conductive layer 2 of an adjacent cell through the third kind parting line grooves D2*a*. That is, the adjacent strip cells are mutually electrically connected in series. It is to be noted that, although only the limited number of photoelectric conversion cells are shown on one substrate in FIG. 1(*h*) for the sake of simplification of the drawing, a larger number of photoelectric conversion cells are usually formed. Further, it should be noted that the thickness of each of the layers is appropriately and significantly enlarged for the sake of clarification of the drawing.

As described above, in the integrated-type thin film photoelectric converter shown in FIG. 1, since the first kind parting line grooves D0 for parting the laser light absorption layer 3 is provided, the transparent conductive layer 2 and the back electrode layer 4 can be electrically connected with each other through the first kind parting line grooves D0. This can make the laser beam LB2*a* for parting the semiconductor photoelectric conversion layer 5 and the laser beam LB3*a* for parting the light receiving side transparent electrode layer 6 incident from the transparent substrate 1 side. Consequently, in Embodiment 1 of the present invention, damage to the back electrode layer 4 inside the parting line grooves D2 as in FIG. 6(*d*) according to the prior art can be avoided, setting of a depth of the parting line grooves D3 up to halfway through the semiconductor photoelectric conversion layer 5 as in FIG. 6(*f*) is unnecessary, and the back electrode layer 4 is not damaged along the parting line grooves D3.

Further, in Embodiment 1 of the present invention, all of the laser beams LB0, LB1, LB2*a* and LB3*a* which are used can be incident from the transparent substrate 1 side, and thus, reversing the front and the back of the substrate between different laser processing is unnecessary. Since a device and an operation for reversing the substrate are unnecessary, productivity can be improved and production cost can be reduced, especially in the case of producing an integrated-type thin film photoelectric converter on a substrate with a large area. Further, since reversing the substrate between different laser processing is unnecessary, positioning between the different laser processing can be facilitated, thereby also contribute to improvement in processing accuracy.

Especially in production of the photoelectric converter with a large area, since reversing the front and the back of the substrate requires a large-scaled converter and further makes highly accurate positioning difficult, it is highly advantageous to apply the configuration of the present invention in which reversing the front and the back is unnecessary. From such a viewpoint, the photoelectric converter of the present invention preferably has a large area. Specifically, a size of the substrate is not smaller than 910 mm×455 mm (0.41 $m^2$), preferably not smaller than 0.5 $m^2$, more preferably not smaller than 1000 mm×1000 mm (1.0 $m^2$), even more preferably not smaller than 1000 mm×1300 mm (1.3 $m^2$) or not smaller than 1000 mm×1400 mm (1.4 $m^2$), and particularly preferably not smaller than 1200 mm×1200 mm (1.44 $m^2$). There is no limit for an applicable size of the substrate, and for example, it is possible to apply the configuration of the present invention to a substrate with a size not smaller than 2000 mm×2000 mm (4.0 $m^2$).

Moreover, although FIGS. 1(*a*) to 1(*h*) illustrate the transparent substrate 1 so as to be located below the transparent conductive layer 2 from the viewpoint of facilitating understanding of the manufacturing process of the integrated-type thin film photoelectric converter, it is preferable in the present invention to perform irradiation with a laser beam so as to form the parting line grooves in the state of the transparent substrate 1 being located above the transparent conductive layer in a vertical direction. Fragments which are generated by processing of each of the layers, such as the back electrode layer, at the time of forming the parting line grooves by irradiation with a laser beam are discharged outside the photoelectric converter by the laser. When the transparent substrate 1 side is arranged above, irradiation with a laser beam is performed from above, whereby the dust drops downward by gravitation to be suppressed from returning into the photoelectric converter. It is thus possible to suppress deterioration in photoelectric conversion performance, such as a short circuit caused by dust generated at the time of processing.

Figure 2:
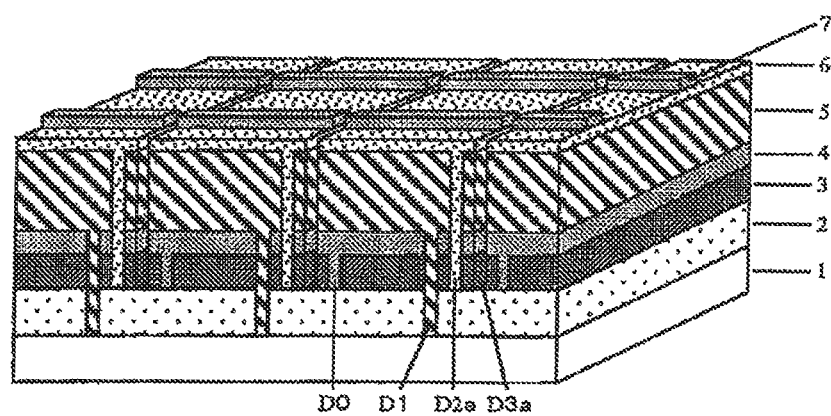
FIG. 2 is a schematic perspective view showing an example of the integrated-type thin film photoelectric converter according to Embodiment 1 of the present invention.

According to an application of Embodiment 1 of the present invention, an integrated-type thin film photoelectric converter as shown in a schematic perspective view of FIG. 2 can also be produced. In production of this integrated-type thin film photoelectric converter, after formation of grid metal electrode wires 7 on the light receiving side transparent electrode layer 6, the laser beam LB3a is incident from the transparent substrate 1 side to form fourth kind parting line grooves D3a, thereby parting the grid metal electrode wires 7 with respect to each cell. In the integrated-type thin film photoelectric converter of FIG. 2, an electric charge can be collected from the light receiving side transparent electrode layer 6 with relatively large resistivity to the grid metal electrode wires 7 for efficient carriage, whereby it is possible to reduce a series resistance component, so as to increase a width of each cell. Increasing the width of each cell can reduce the number of parting line grooves D0, D1, D2a and D3a, thereby simplify the laser processing.

As described above, according to Embodiment 1 of the present invention, an integrated-type thin film photoelectric converter excellent in photoelectric conversion characteristics can be provided with high processing accuracy and high production efficiency at low cost.

Embodiment 2

Figure 3:
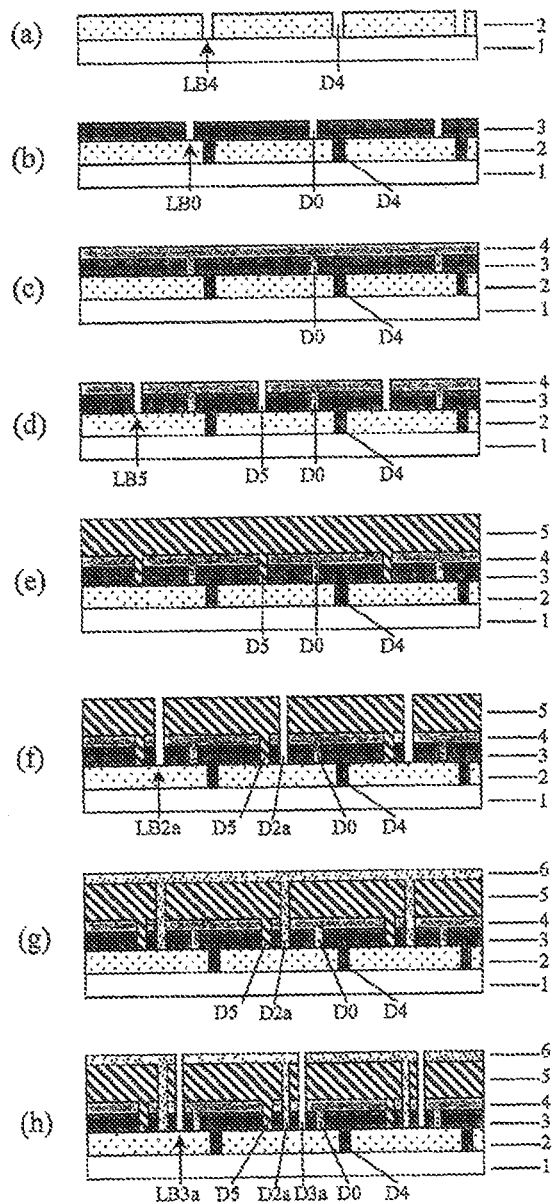
FIG. 3 is a schematic sectional view for explaining a manufacturing process of a integrated-type thin film photoelectric converter according to Embodiment 2 of the present invention.

FIG. 3 illustrates a schematic sectional view of a method for producing an integrated-type thin film photoelectric converter according to Embodiment 2 of the present invention.

Similarly to Embodiment 1, Embodiment 2 includes a transparent conductive layer 2, a laser light absorption layer 3, a back electrode layer 4, a semiconductor photoelectric conversion layer 5 and a light receiving side transparent electrode layer 6, stacked sequentially on a transparent substrate 1. Each of these layers is parted into a plurality of strip photoelectric conversion cell regions by a plurality of parting line grooves provided in parallel, and those plurality of photoelectric conversion cells are electrically connected in series.

Embodiment 2 is in common with Embodiment 1 in terms of the configuration in the following respects: the laser light absorption layer 3 being parted into a plurality of strip regions by a plurality of first kind parting line grooves D0 which penetrate the laser light absorption layer 3; the semiconductor photoelectric conversion layer 5 being parted into a plurality of strip photoelectric conversion regions by a plurality of the third kind parting line grooves D2 which penetrate the laser light absorption layer 3, the back electrode layer 4 and the semiconductor photoelectric conversion layer 5; the light receiving side transparent electrode layer 6 being parted into a plurality of strip light receiving side transparent electrode regions by a plurality of fourth kind parting line grooves D3 which penetrate the laser light absorption layer 3, the back electrode layer 4, the semiconductor photoelectric conversion layer 5 and the light receiving side transparent electrode layer 6; and between the photoelectric conversion cells which are mutually adjacent, the back electrode region of the one cell being electrically connected to the receiving side transparent electrode region of the other cell through the first kind parting line grooves D0, the transparent conductive layer 2 and the third kind parting line grooves D2.

In Embodiment 2, as for the transparent substrate 1, the transparent conductive layer 2, the laser light absorption layer 3, the back electrode layer 4, the semiconductor photoelectric conversion layer 5 and the light receiving side transparent electrode layer 6, similar ones are formed in a similar manner to those described in the description of Embodiment 1.

In above-mentioned Embodiment 1, the back electrode layer 4 is parted into a plurality of strip back electrode regions by the second kind parting line grooves D1 which penetrate the transparent conductive layer 2, the laser light absorption layer 3 and the back electrode layer 4, whereas in Embodiment 2, in place of the above grooves, the fifth kind parting line grooves D4 which penetrate the transparent conductive layer 2 and the sixth kind parting line grooves D5 which penetrate the laser light absorption layer 3 and the back electrode layer 4 are provided. The transparent conductive layer 2 is parted into a plurality of strip light receiving side transparent conductive regions by a plurality of fifth kind parting line grooves D4, and the back electrode layer 4 is parted into a plurality of strip back electrode regions by a plurality of sixth kind parting line grooves D5.

FIG. 3 illustrates the schematic sectional view of an example of the method for producing an integrated-type thin film photoelectric converter according to Embodiment 2 of the present invention. In the following, the method for producing integrated-type thin film photoelectric converter in Embodiment 3 shown in FIG. 3 is described. It is to be noted that in FIG. 3, like reference numerals as in FIG. 1 denote like or corresponding portions to above-mentioned Embodiment 1. Further, in the following description, contents overlapping with those of above-mentioned Embodiment 1 are omitted.

First, in FIG. 3(a), a transparent conductive layer 2 is deposited on a transparent substrate 1 such as glass. Subsequently, the transparent conductive layer 2 is parted into a plurality of regions by the fifth kind parting line grooves D4 which are formed by a laser beam LB4 incident from the transparent substrate 1 side. The laser beam LB4 used here is to be absorbed into the transparent conductive layer 2, and hence the transparent conductive layer 2 is subjected to parting processing to form the fifth kind parting line grooves D4 with relative ease. The plurality of fifth kind parting line grooves D4 as thus formed are mutually in parallel and extending in a direction perpendicular to the surface of the figure.

In FIG. 3(b), a laser light absorption layer 3 is deposited so as to cover the parted transparent conductive layer 2 and the fifth kind parting line grooves D4.

Subsequently, the laser light absorption layer 3 is parted into a plurality of regions by the first kind parting line grooves D0 which are formed by the laser beam LB0 incident from the transparent substrate 1 side.

In FIG. 3(c), a back electrode layer 4 is deposited so as to cover the parted laser light absorption layer 3.

In FIG. 3(d), the laser light absorption layer 3 and the back electrode layer 4 are parted into a plurality of regions by a sixth kind parting line grooves D5 which are formed by a laser beam LB5 incident from the transparent substrate 1 side. The laser beam LB5 used here is not absorbed into the transparent conductive layer 2, but is absorbed into the laser light absorption layer 3 to generate heat, whereby the laser light absorption layer 3 and the back electrode layer 4 are subjected to parting processing to form the sixth kind parting line grooves D5 with relative ease. The plurality of parting line grooves D5 as thus formed extending in parallel.

In FIG. 3(e), the semiconductor photoelectric conversion layer 5 is deposited so as to cover the parted back electrode layer 4 and the sixth kind parting line grooves D5.

In FIG. 3(f), the laser light absorption layer 3, the back electrode layer 4 and the semiconductor photoelectric conversion layer 5 are parted into a plurality of regions by a laser beam LB2a incident from the transparent substrate 1 side.

In FIG. 3(g), a light receiving side transparent electrode layer 6 is deposited so as to cover the parted semiconductor photoelectric conversion layer 5 and the parting line grooves D2a.

Finally, in FIG. 3(h), the laser light absorption layer 3, the back electrode layer 4, the semiconductor photoelectric conversion layer 5 and the light receiving side transparent electrode layer 6 are parted into a plurality of regions by a laser beam LB3a incident from the transparent substrate 1 side.

Further, in Embodiment 2 of the present invention, as in above-mentioned Embodiment 1, damage to the back electrode layer 4 can be avoided inside the third kind parting line grooves D2, and the back electrode layer 4 is not damaged along the fourth kind parting line grooves D3.

Moreover, since all the laser beams LB4, LB0, LB5, LB2a and LB3a which are used can be incident from the transparent substrate 1 side, irradiation with a laser beam is performed to form the parting line grooves such that the transparent substrate is located above the transparent conductive layer 2 in a vertical direction, thereby suppress deterioration in photoelectric conversion performance, such as a short circuit due to fragments generated at the time of processing.

Furthermore, as in Embodiment 1, after formation of grid metal electrode wires 7 on the light receiving side transparent electrode layer 6, the laser beam LB3a is incident from the transparent substrate 1 side to form the fourth kind parting line grooves D3a, thereby parting the grid metal electrode wires 7 with respect to each cell, and it is thus possible to collect an electric charge from the light receiving side transparent electrode layer 6 with relatively large resistivity to the grid metal electrode wires 7 for efficient carriage, so as to reduce a series resistance component.

Embodiment 2A

As an example of Embodiment 2, Embodiment 2A in which the fifth kind parting line grooves (D4) and the sixth kind parting line grooves D5 are connected with each other may also be adopted. When the fifth kind parting line grooves D4 and the sixth kind parting line grooves D5 are connected with each other as thus described, these parting line grooves become equivalent to the second kind parting line grooves D1 in Embodiment 1. The second kind parting line grooves D1 are formed so as to penetrate the transparent conductive layer 2, the laser light absorption layer and the back electrode layer 4 in Embodiment 1, whereas in Embodiment 2, the fifth kind parting line grooves D4 which penetrate the transparent conductive layer 2 and the sixth kind parting line grooves D5 which penetrate the laser light absorption layer 3 and the back electrode layer 4 are individually formed. Therefore, in Embodiment 2, problems of degeneration of processed cross-sectional surface on the peripheries of the parting line grooves D4 and D5 and of rising of films on the peripheries of those parting line grooves due to the degeneration and the like are suppressed, so that a fill factor of the photoelectric converter is possible to be maintained high. Configurations and examples of manufacturing of such embodiments are described in more detail in later Examples.

Embodiment 2B

Figure 4:
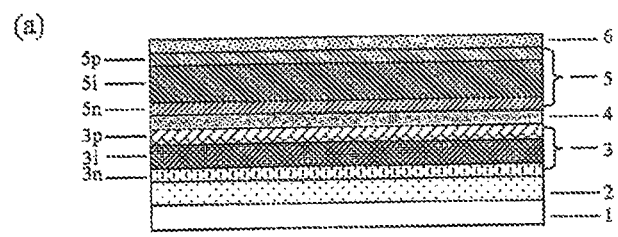
FIG. 4 is a schematic sectional view for explaining stacked forms of a laser light absorption layer and a semiconductor photoelectric conversion layer in an integrated-type thin film photoelectric converter according to Embodiment 2B of the present invention.
Figure 4:
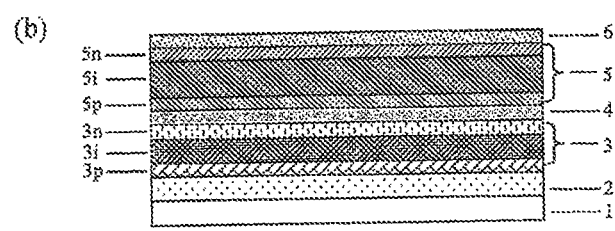

Here, Embodiment 2B as another example of Embodiment 2 is described. In Embodiment 2B, the laser light absorption layer 3 includes a pn junction or a pin junction of a semiconductor. In other words, in FIG. 3(b), the laser light absorption layer 3 includes the pn junction or the pin junction, and are formed so as to have rectifying characteristics. The pn junction or the pin junction of this laser light absorption layer 3 is formed such that its conductive layer and a reverse conductive layer of a pin junction of the semiconductor photoelectric conversion layer 5 are facing each other. Specifically, as shown in FIG. 4(a), when the pin junction of the semiconductor photoelectric conversion layer 5 is formed such that an n-type layer 5n is located on the back electrode layer 4 side, the pn junction or the pin junction of the laser light absorption layer 3 is formed such that a p-type layer 3p is located on the back electrode layer 4 side. On the contrary, when the pin junction of the semiconductor photoelectric conversion layer 5 is formed such that a p-type layer 5p is located on the back electrode layer 4 side, the pn junction or the pin junction of the laser light absorption layer 3 is formed such that an n-type layer 3n is located on the back electrode layer 4 side. It is to be noted that in FIGS. 4(a) and 4(b), each of the parting line grooves is omitted. Further, although not shown, in the case of the photoelectric conversion layer 5 being a tandem photoelectric conversion layer having a plurality of pin junctions, a pin junction being the closest to the back electrode layer 4 in the photoelectric conversion layer and the pn junction or the pin junction of the laser light absorption layer may be formed such that the reverse conductive type layers are facing each other.

In Embodiment 2B, each of the parting line grooves is arrayed in the order corresponding to the sixth kind parting line grooves D5, the third kind parting line grooves D2, the fourth kind parting line grooves D3, the first kind parting line grooves D0 and the fifth kind parting line grooves D4.

FIG. 5(a) shows a schematic sectional view of the thin film photoelectric converter of Embodiment 2B. In each photoelectric conversion cell region A of this thin film photoelectric converter, a photoelectric conversion function region B is formed in which a back electrode region, a photoelectric conversion region and a light receiving side transparent electrode region are sequentially stacked. Between the photoelectric conversion cell regions which are mutually adjacent, the back electrode region of one photoelectric conversion cell region A1 is electrically connected to the light receiving side transparent electrode region of a photoelectric conversion cell region A2 adjacent through the first kind parting line groove D0, the transparent conductive layer 2 and the third kind parting line groove D2. This leads to electrical connection of a plurality of photoelectric conversion cell regions in series.

Since the laser light absorption layer 3 includes the pn junction or the pin junction of the semiconductor, the transparent conductive region, the laser light absorption region and the back electrode region form a diode region C in each of the photoelectric conversion cell regions. The back electrode region of the one photoelectric conversion cell region A1 is electrically connected to the back electrode region of the photoelectric conversion cell region A2 through the first kind parting line grooves D0, the transparent conductive layer 2 and the laser light absorption layer 3, thereby leading to electrical connection of a plurality of photoelectric conversion cell regions to adjacent photoelectric conversion cells through the laser light absorption layer 3. Since the pn junction or the pin junction of the laser light absorption region in the diode region C and the pin junction of the semiconductor photoelectric conversion region in the photoelectric conversion function region B are formed such that reverse conductive layers are facing each other, the photoelectric conversion function region B1 and the diode region C1 are electrically connected in parallel inside the same photoelectric conversion cell region. Consequently, the diode region C1 has a rectifying characteristics being reverse to that of the photoelectric conversion function region B1 inside the same cell, and thus the diode region C1 functions as a bypass diode.

FIG. 5(b) shows an example of an equivalent circuit schematic of the integrated-type thin film photoelectric converter of Embodiment 2B as thus described. As shown in FIG. 5(b), in the integrated-type thin film photoelectric converter of Embodiment 2B, each of the bypass diode regions C is connected to the photoelectric conversion function region B in each of the photoelectric conversion cell regions A. As for the pn junction or the pin junction of the diode region C and the pin junction of the photoelectric conversion cell region A, for example as shown in FIG. 4(a), in the case where the semiconductor photoelectric conversion layer 5 is a semiconductor junction in which the n-type layer 5n, an i-type layer 5i and the p-type layer 5p are stacked sequentially from the back electrode layer 4 side, the laser light absorption layer 3 may be a semiconductor junction having a configuration in which the n-type layer 3n, an i-type layer 3i and the p-type layer 3p are sequentially stacked from the transparent conductive layer 2 side. Further, on the contrary, as shown in FIG. 4(a), in the case where the semiconductor photoelectric conversion layer 5 is a semiconductor junction in which the p-type layer 5p, the i-type layer 5i and the n-type layer 5n are sequentially stacked from the back electrode layer 4 side, the laser light absorption layer 3 may be a semiconductor junction in which the p-type layer 3p, the i-type layer 3i and the n-type layer 3n are sequentially stacked from the transparent conductive layer 2 side. Thereby, the pn junction or the pin junction of the diode region C and the pin junction of the photoelectric conversion function region B are arranged such that the reverse conductive layers are facing each other. Here, the laser light absorption layer 3 is sufficient so long as having the rectifying characteristic in an appropriate direction, and a pn junction or an np junction with the i-type layer 3i being nonexistent can also be selected as appropriate.

In the conventional integrated-type thin film photoelectric converter such as in above-mentioned Patent Document 1 (Japanese Patent Application Laid-Open No. 10-79522), when a shadow, in which sunlight is not irradiated, is made in part of a cell, the cell is applied with a voltage generated by another cell in a reverse direction, and thereby a phenomenon, so-called "hot spot phenomenon", may occur in which the voltage locally exceeds a reverse breakdown voltage and a breakdown occurs, bringing about a short-circuit state, and a large current thus flows to generate heat. When such a hot spot phenomenon occurs, it causes deterioration in appearance of the whole of the integrated-type thin film photoelectric converter and degradation in output characteristics. It is known that in order to avoid such a problem, bypass diodes are connected in parallel to a plurality of serially connected photoelectric conversion cells. According to such a configuration, even when a shade is created in part of a photoelectric conversion cell, it is possible to flow an output current, generated in another serially connected cell, to the shadowed cell without a breakdown by a function of the bypass diode connected in parallel and in a reverse direction, thereby suppress a generation of the hot spot phenomenon. On the other hand, there has been a problem in that newly forming a bypass diode layer in the stacked structure of the photoelectric converter and connecting the layer to each of the photoelectric conversion cells in parallel cause complication of the stacked structure and an increase in cost due to significantly increased time for film formation.

As opposed to this, according to Embodiment 2B of the present invention, the laser light absorption layer 3 for producing the integrated-type thin film photoelectric converter also functions as the bypass diode layer. Therefore, a highly reliable integrated-type thin film photoelectric converter in which appearance deterioration and performance degradation caused by the hot spot phenomenon are suppressed can be obtained at low cost with ease.

As described above, according to Embodiment 2 of the present invention, an integrated-type thin film photoelectric converter excellent in photoelectric conversion characteristics can be provided with high processing accuracy and high production efficiency at low cost. Further, according to Embodiment 2B of the present invention, a highly reliable integrated-type thin film photoelectric converter, resistant to appearance deterioration and performance degradation due to the hot spot phenomenon, can be provided with high processing accuracy and high productivity at low cost.

EXAMPLES

As specific examples corresponding to the embodiments according to the present invention as described above, a number of examples are described below along with comparative examples. It goes without saying that the present invention is not limited to the following examples.

Examples Regarding Embodiment 1

Example 1

In Example 1 of the present invention, an integrated-type thin film photoelectric converter was produced in accordance with FIG. 1. First, in FIG. 1(a), the transparent conductive layer 2 of tin oxide and the laser light absorption layer 3 were sequentially stacked on the transparent glass substrate 1. The transparent conductive layer 2 was deposited to have a thickness of about 800 nm by thermal CVD method. The transparent conductive layer 2 as thus deposited has a surface texture structure including fine roughness. This surface texture structure influences a surface structure of the metal layer in the back electrode layer 4 which is to be deposited later. The fine surface unevenness on the metal layer surface can generate diffuse reflection of light to function for enhancing light absorption efficiency inside the semiconductor photoelectric conversion layer 5.

As the laser light absorption layer 3, an amorphous silicon (a-Si) layer having thickness of 200 nm was deposited by a plasma CVD method. It is to be noted that the laser light absorption layer 3 may have a thickness large enough to enable later performance of all laser beam processing, and can have a thickness selected as appropriate based upon this premise.

In FIG. 1(b), a laser beam LB0 of a second harmonic of a Q-switched YAG laser (wavelength of 532 nm) was irradiation from the transparent glass substrate 1 side to process the laser light absorption layer 3 for formation of the parting line grooves D0. The laser beam LB0 used here may serve for parting processing on the laser light absorption layer 3 without damaging the transparent conductive layer 2. For example, in respect of the YAG laser, the laser light absorption layer 3 of a-Si can well absorb light of the second harmonic (wavelength of 532 nm). Meanwhile, the transparent conductive layer 2 well absorbs infrared beam of a fundamental wave of the YAG laser (wavelength of 1064 nm). However, in respect of light of the second harmonic of the YAG laser (wavelength of 532 nm), the transparent conductive layer 2 is almost transparent and only absorbs a slight amount of the light. Therefore, for example by performing irradiation with the laser beam LB0 which is the second harmonic of the YAG laser and has a power density of 12 kW/cm$^2$ and a sectional diameter of 60 µm, only the laser light absorption layer 3 can be subjected to parting processing without damaging the transparent conductive layer 2.

As thus described, as the laser beam for performing parting processing on the laser light absorption layer 3 without damaging the transparent conductive layer 2, one being almost transparent with respect to the transparent conductive layer 2 and being absorbable into the laser light absorption layer 3 is preferred, and other than the second harmonic of the YAG laser (wavelength of 532 nm), for example, a second harmonic of YVO4 (yttrium vanadate) laser that emits a laser light with the same wavelength as the above second harmonic, a fiber laser capable of emitting a laser with substantially the same wavelength or the like can be used.

In FIG. 1(c), the back electrode layer 4 was deposited so as to cover the parted laser light absorption layer 3 and the parting line grooves D0. As the back electrode layer 4, a zinc oxide layer having a thickness of 90 nm as a first transparent electrode layer, a silver layer having a thickness of 200 nm as a metal layer and a zinc oxide layer having a thickness of 90 nm as a second transparent electrode layer were sequentially deposited by sputtering method. The zinc oxide layer included in the back electrode layer 4 is preferred for improving adhesive strength between the silver layer and the laser light absorption layer 3 as well as the semiconductor photoelectric conversion layer 5 to be deposited later, and enhancing a reflectance of silver.

In FIG. 1(d), irradiation with the infrared laser beam LB1 of the fundamental wave of the Q-switched YAG laser (wavelength of 1064 nm) was performed from the transparent glass substrate 1 side, and the transparent conductive layer 2, the laser light absorption layer 3 and the back electrode layer 4 were processed to form the parting line grooves D1. As described above, since the transparent conductive layer 2 can absorb the infrared light of the fundamental wave of the YAG laser (wavelength of 1064 nm) to generate heat, those layers and the back electrode layer 4 can be simultaneously subjected to parting processing with relative ease due to heat generation of the transparent conductive layer 2 and the laser light absorption layer 3 by the laser beam LB1.

As thus described, a laser beam absorbable into the transparent conductive layer 2 is preferably used as the laser beam LB1 for performing parting processing on the transparent conductive layer 2 and the other layers. Other than the fundamental wave of the YAG laser (wavelength of 1064 nm), for example, a fundamental wave of the YVO4 laser that emits a laser light with the same wavelength as the above fundamental wave, a fiber laser capable of emitting a laser with substantially the same wavelength or the like may be used as the laser beam LB1.

In FIG. 1(e), the semiconductor photoelectric conversion layer 5 was deposited by a plasma CVD method so as to cover the parted back electrode layer 4 and the parting line grooves D1. The semiconductor photoelectric conversion layer 5 includes an n-type microcrystalline Si layer with a thickness of about 20 nm, an i-type a-Si:H (a-Si including H) layer with a thickness of about 300 nm and a p-type a-SiC:H (a-SiC including H) layer with a thickness of about 15 nm, which are sequentially disposed. In other words, the semiconductor photoelectric conversion layer 5 in present Example 1 includes a single photoelectric conversion unit comprising a pair of nip junctions in parallel with its principal surface.

In FIG. 1(f), irradiation with the laser beam LB2 of the second harmonic of the Q-switched YAG laser (wavelength of 532 nm) was performed from the transparent glass substrate 1 side to form the parting line grooves D2a. Since the laser beam LB2a with a wavelength of 532 nm is efficiently absorbed by the laser light absorption layer 3 and the semiconductor photoelectric conversion layer 5 to generate heat, those layers and the back electrode layer 4 can be simultaneously subjected to parting processing with relative ease.

In FIG. 1(g), the light receiving side transparent electrode layer 6 of indium oxide having a thickness of about 80 nm was deposited by electron beam evaporation so as to cover the parted semiconductor photoelectric conversion layer 5 and the parting line grooves D2a.

In FIG. 1(h), irradiation with the laser beam LB3a of the second harmonic of the Q-switched YAG laser (wavelength of 532 nm) was performed from the transparent glass substrate 1 to form the parting line grooves D3a. Since the laser beam LB3a with a wavelength of 532 nm is efficiently absorbed by the laser light absorption layer 3 and the semiconductor photoelectric conversion layer 5 to generate heat, along with those layers, the back electrode layer 4 and the light receiving side transparent electrode layer 6 can also be simultaneously subjected to parting processing with relative ease.

The integrated-type thin film photoelectric converter obtained in present Example 1 was connected with a lead, and irradiated with light of AM 1.5 having an intensity of 100 mW/cm$^2$ by use of a solar simulator at an environmental temperature of 25° C. to measure photoelectric conversion characteristics. Results of the measurement were: a short-circuit current density was 16.21 mA/cm$^2$; an open circuit voltage per one cell was 0.891 V; a fill factor being 0.727, and a photoelectric conversion efficiency was 10.5%.

Example 2

Although an integrated-type thin film photoelectric converter according to Example 2 of the present invention was also produced by the process illustrated in FIG. 1, it was changed as compared with Example 1 only in the following respects (1) and (2).

(1) In the process of FIG. 1(a), the thickness of the laser light absorption layer 3 was not 200 nm but increased to 400 nm.

(2) In the process of FIG. 1(e), the semiconductor photoelectric conversion layer 5 was changed to a tandem type including: a bottom photoelectric conversion unit including a bottom nip junction and a top photoelectric conversion unit including a top nip junction. As this bottom photoelectric conversion unit, an n-type microcrystalline Si layer with a thickness of about 20 nm, an i-type microcrystalline silicon photoelectric conversion layer with a thickness of about 2 µm and a p-type microcrystalline Si layer with a thickness of about 15 nm were sequentially deposited. On the other hand, the top photoelectric conversion unit was formed on the same condition as the photoelectric conversion unit in Example 1.

Example 3

In Example 3 of the present invention, an integrated-type thin film photoelectric converter corresponding to FIG. 2 was produced. In production of the integrated-type thin film photoelectric converter of present Example 3, the difference as compared with Example 2 was only that the grid metal electrode wires 7 of aluminum were additionally formed on the light receiving side transparent electrode layer 6 by vapor deposition in the process of FIG. 1(g). In other words, the semiconductor photoelectric conversion layer 5 in present Example 3 is also the same tandem type as in the case of Example 2.

Example 4

Although in Example 4 of the present invention, an integrated-type thin film photoelectric converter with the semiconductor photoelectric conversion layer 5 being a tandem type was produced by the process illustrated in FIG. 1 as in Example 2, it was different from Example 2 in use of a second harmonic of a Q-switched YAG laser (wavelength of 532 nm) having a power density of 60 kW/cm² as the laser beam LB1 in the process of FIG. 1(d) in place of using the fundamental wave of the Q-switched YAG laser (wavelength of 1064 nm).

In the process of FIG. 1(b) of Example 1 and the like, by the laser beam LB0 of the second harmonic of the YAG laser (wavelength of 532 nm) having a power density of 12 kW/cm², only the laser light absorption layer 3 was subjected to parting processing to form the first kind parting line grooves D0 of without damaging the transparent conductive layer 2. As opposed to this, in Example 4, a laser beam of a second harmonic of the YAG laser (wavelength of 532 nm) having a power density of 60 kW/cm² was used to form the grooves D1 which also penetrates the transparent conductive layer 2. It is found therefrom that, since the transparent conductive layer 2 is almost transparent with respect to light of the second harmonic of the YAG laser (wavelength of 532 nm) and only slightly absorbs the light, the transparent conductive layer 2 is not processed in the case of the second harmonic of the YAG laser having a power density of 12 kw/cm², whereas in the case of the second harmonic of the YAG laser having a high power density of 60 kW/cm², the transparent conductive layer 2 is subjected to parting processing in a similar manner to the case of using the fundamental wave of the Q-switched YAG laser (wavelength of 1064 nm) which is absorbed into the transparent conductive layer.

Example 5

Although in Example 5 of the present invention, an integrated-type thin film photoelectric converter with the semiconductor photoelectric conversion layer 5 being a tandem type was produced as in Example 2 by the process illustrated in FIG. 1, in the process of FIG. 1(c), it was different from Example 2 in production of the first transparent conductive layer of the back electrode layer 4 by MOCVD method.

Examples Relating Embodiment 2A

Example 6

Although in Example 6 of the present invention, an integrated-type thin film photoelectric converter with the semiconductor photoelectric conversion layer 5 being a tandem type was produced as in Example 2 by the process illustrated in FIG. 7, it was different from Example 2 in the following respect.

Figure 7:
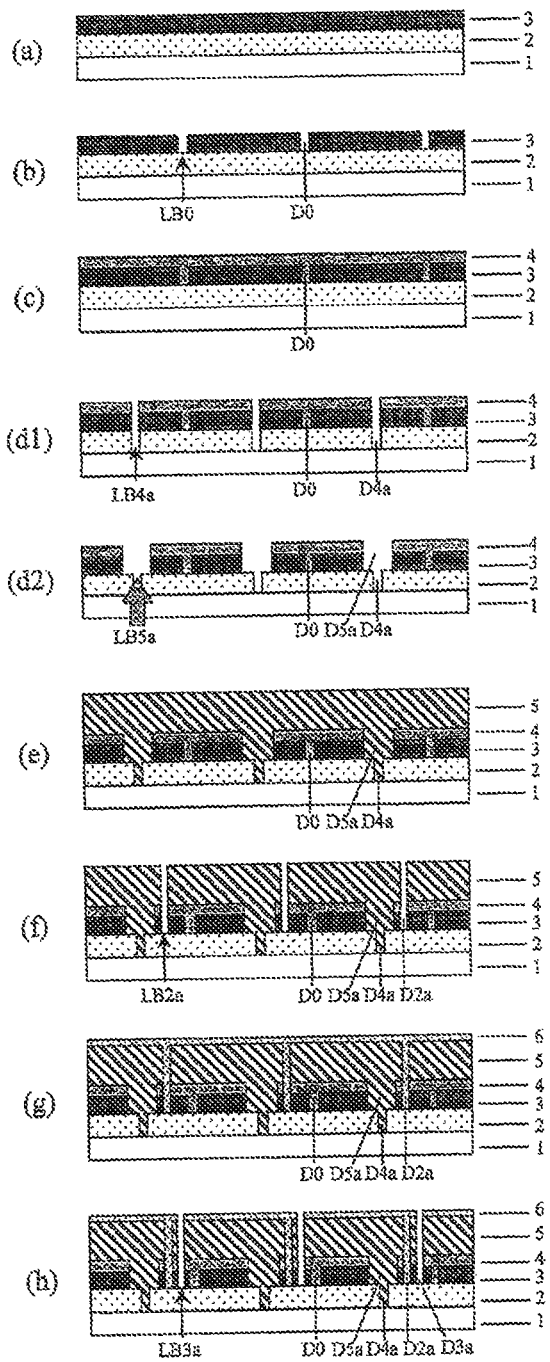
FIG. 7 is a schematic sectional view for explaining a manufacturing process of a integrated-type thin film photoelectric converter in Embodiment 6.

In place of the process of FIG. 1(d) in Example 2, as in FIG. 7(d1), parting line grooves D4a were formed in the transparent conductive layer 2, the laser light absorption layer and the back electrode layer 4 by laser beam LB4a of the fundamental wave of the Q-switched YAG laser (wavelength of 1064 nm) which was incident from the transparent substrate 1 side. Further, as in FIG. 7(d2), the laser light absorption layer 3 and the back electrode layer 4 were irradiated with a laser beam LB5a of the second harmonic of the Q-switched YAG laser (wavelength of 532 nm) having a larger beam diameter than that of the laser beam LB4a over the parting line grooves D4a, thereby forming parting line grooves D5a.

The fifth kind parting line grooves D4a and the sixth kind parting line grooves D5a were formed by these processes, and as shown in FIG. 7(f), an integrated-type thin film photoelectric converter was produced in which the fifth kind parting line grooves D4a and sixth kind the parting line grooves D5a were connected with each other, and the fifth kind parting line grooves D4a have smaller widths than those of the sixth kind parting line grooves D5a and were formed inside the sixth kind parting line grooves D5a.

Example 7

Although in Example 7 of the present invention, an integrated-type thin film photoelectric converter with the semiconductor photoelectric conversion layer 5 being a tandem type was produced as in Example 2 by the process illustrated in FIG. 7, it was different from Example 2 in the following respect.

Figure 8:
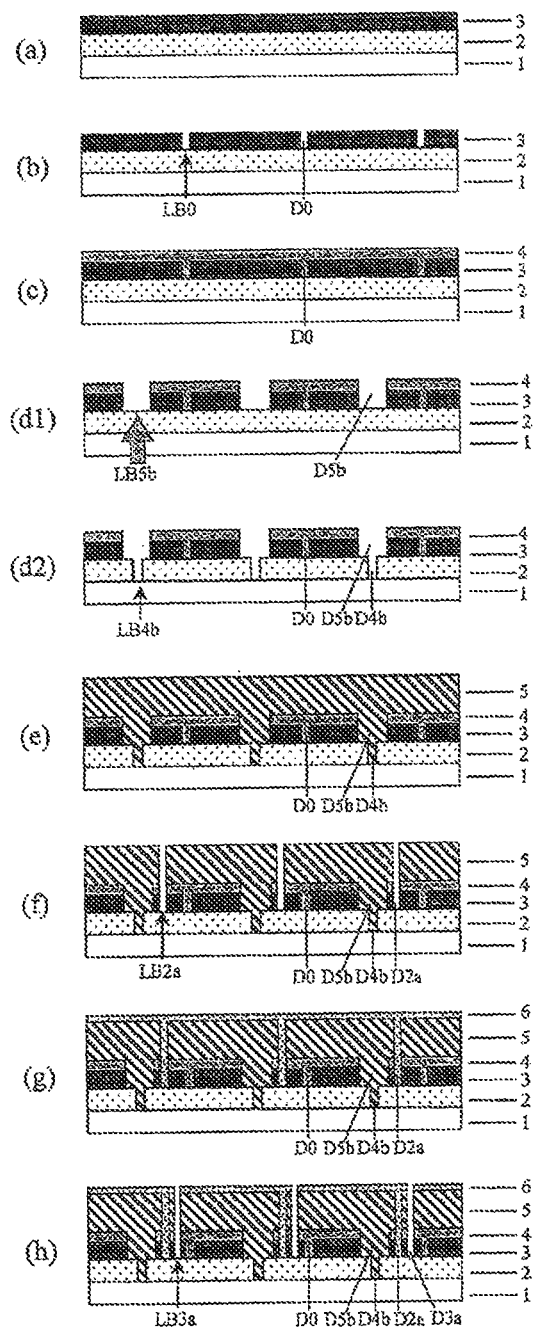
FIG. 8 is a schematic sectional view for explaining a manufacturing process of an integrated-type thin film photoelectric converter in Embodiment 7.

In place of the process of FIG. 1(d) in Example 2, as in FIG. 8(d1), parting line grooves D5b were formed to part the laser light absorption layer 3 and the back electrode layer 4 by a laser beam LB5b of the second harmonic of the Q-switched YAG laser (wavelength of 532 nm) incident from the transparent substrate 1 side. Further, as in FIG. 8(d2), the transparent conductive layer 2 was irradiated with the laser beam LB4b of the fundamental wave of the Q-switched YAG laser (wavelength of 1064 nm) having a smaller beam diameter than that of the laser beam LB5b over the parting line grooves D5b, thereby forming parting line grooves D4b.

The fifth kind parting line grooves D4b and the sixth kind parting line grooves D5b were formed by these processes, and as shown in FIG. 8(f), an integrated-type thin film photoelectric converter was produced in which the fifth kind parting line grooves D4b and the sixth kind parting line grooves D5b were connected with each other, and the fifth kind parting line grooves D4b have smaller widths than those of the sixth kind parting line grooves D5b and were formed inside the sixth kind parting line grooves D5b.

Example 8

Although in Example 8 of the present invention, an integrated-type thin film photoelectric converter with the semiconductor photoelectric conversion layer 5 being a tandem type was produced as in Example 2 by the process illustrated in FIG. 9, it was different as compared with Example 2 in (1) and (2) below.

Figure 9:
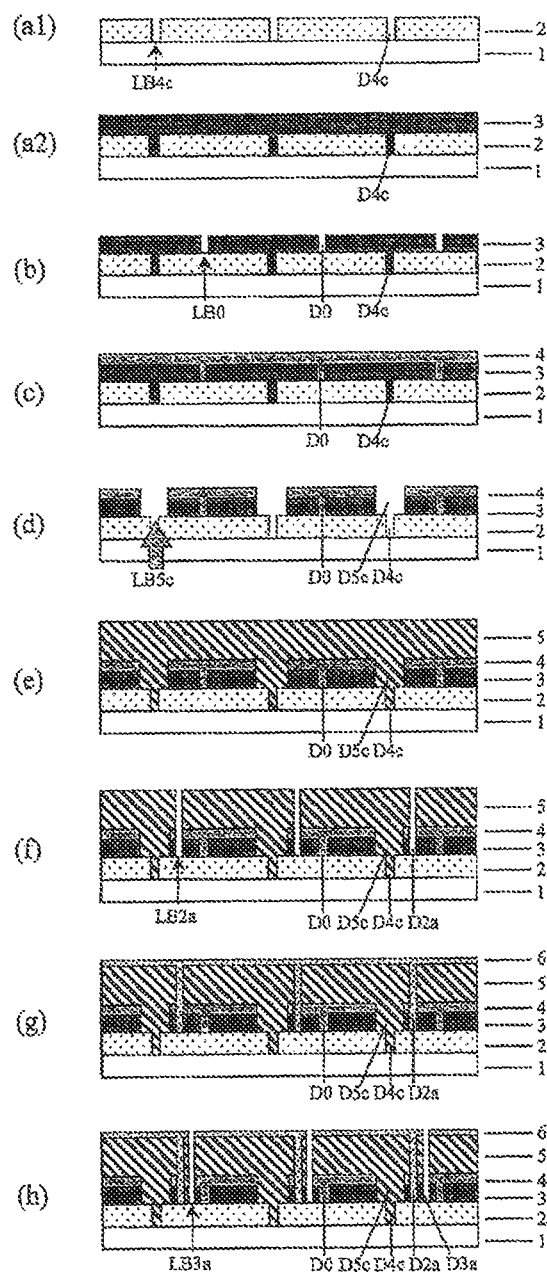
FIG. 9 is a schematic sectional view for explaining a manufacturing process of an integrated-type thin film photoelectric converter in Embodiment 8.

(1) In place of the process of FIG. 1(a) in Example 2, as in FIG. 9(a1), parting line grooves D4c were formed by a laser beam LB4c of the fundamental wave of the Q-switched YAG laser (wavelength of 1064 nm) after deposition of the transparent conductive layer 2 on the transparent substrate 1. Subsequently, as in FIG. 9(a2), the laser light absorption layer 3 was deposited.

(2) In place of the process of FIG. 1(d) in Example 2, as in FIG. 9(d), the laser light absorption layer 3 and the back electrode layer 4 were irradiated with a laser beam LB5c of the second harmonic of the Q-switched YAG laser (wavelength of 532 nm) having a larger beam diameter than that of the laser beam LB4c over the above of the parting line grooves D4c, thereby forming parting line grooves D5c.

The fifth kind parting line grooves D4c and the sixth kind parting line grooves D5c were formed by these processes, and as shown in FIG. 9(f), an integrated-type thin film photoelectric converter was produced in which the fifth kind parting line grooves D4c and the sixth kind parting line grooves D5c were connected with each other, and the fifth kind parting line grooves D4c have smaller widths than those of the sixth kind parting line grooves D5c and were formed inside the sixth kind parting line grooves D5c.

Example 9

Although in Example 9 of the present invention, an integrated-type thin film photoelectric converter with the semiconductor photoelectric conversion layer 5 being a tandem type was produced as in Example 2 by the process illustrated in FIG. 10, it was different as compared with Example 2 in (1) and (2) below.

Figure 10:
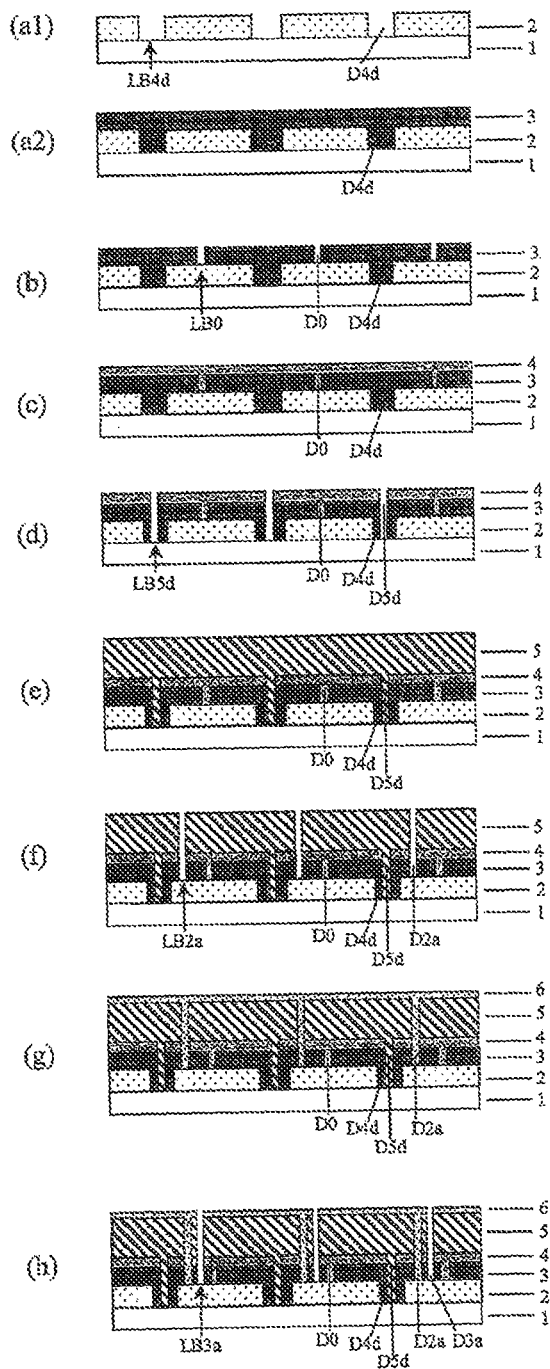
FIG. 10 is a schematic sectional view for explaining a manufacturing process of an integrated-type thin film photoelectric converter in Embodiment 9.

(1) In place of the process of FIG. 1(*a*) in Example 2, as in FIG. 10(a1), parting line grooves D4*d* were formed by a laser beam LB4*d* of the fundamental wave of the Q-switched YAG laser (wavelength of 1064 nm) after deposition of the transparent conductive layer 2 on the transparent substrate 1. Subsequently, as in FIG. 10(a2), the laser light absorption layer 3 was deposited.

(2) In place of the process of FIG. 1(*d*) in Example 2, as in FIG. 10(*d*), the laser light absorption layer 3 and the back electrode layer 4 were irradiated with a laser beam LB5*d* of the second harmonic of the Q-switched YAG laser (wavelength of 532 nm) having a smaller beam diameter than that of the laser beam LB4*d* over the parting line grooves D4*d*, thereby forming parting line grooves D5*d*.

By these processes, as shown in FIG. 10(*f*), an integrated-type thin film photoelectric converter was produced in which the fifth kind parting line grooves D4*d* and the sixth kind parting line grooves D5*d* were connected with each other, and the sixth kind parting line grooves D5*d* have smaller widths than those of the fifth kind parting line grooves D4*d* and were formed inside the fifth kind parting line grooves D4*d*.

Example 10

Although in Example 10 of the present invention, an integrated-type thin film photoelectric converter with the semiconductor photoelectric conversion layer 5 being a tandem type was produced as in Example 7 by the process illustrated in FIG. 8, it was different from Example 7 in use of the second harmonic of the Q-switched YAG laser (wavelength of 532 nm) having a power density of 60 kW/cm$^2$ as the laser beam LB4*b* in the process of FIG. 8(*d*2) in place of using the fundamental wave of the Q-switched YAG laser (wavelength of 1064 nm).

Example 11

Although in Example 11 of the present invention, an integrated-type thin film photoelectric converter with the semiconductor photoelectric conversion layer 5 being a tandem type was produced as in Example 7, it was different from Example 7 in the additional formation of the grid metal electrode wires 7 of aluminum on the light receiving side transparent electrode layer 6 by vapor deposition in the process of FIG. 8(*g*).

Thereby produced was an integrated-type thin film photoelectric converter which includes the grid metal electrode wires on the light receiving side transparent electrode layer and in which the fourth kind parting line grooves penetrate the grid metal electrode wires.

Example 12

Although in Example 12 of the present invention, an integrated-type thin film photoelectric converter with the semiconductor photoelectric conversion layer 5 being a tandem type was produced as in Example 2 by the process illustrated in FIG. 11, it was different as compared with Example 2 in (1) and (2) below.

(1) In place of the process of FIG. 1(*a*) in Example 2, as in FIG. Ma1), parting line grooves D4*e* were formed by a laser beam LB4*e* of the fundamental wave of the Q-switched YAG laser (wavelength of 1064 nm) after deposition of the transparent conductive layer 2 on the transparent substrate 1. Subsequently, as in FIG. 11(a2), the laser light absorption layer 3 was deposited.

Figure 11:
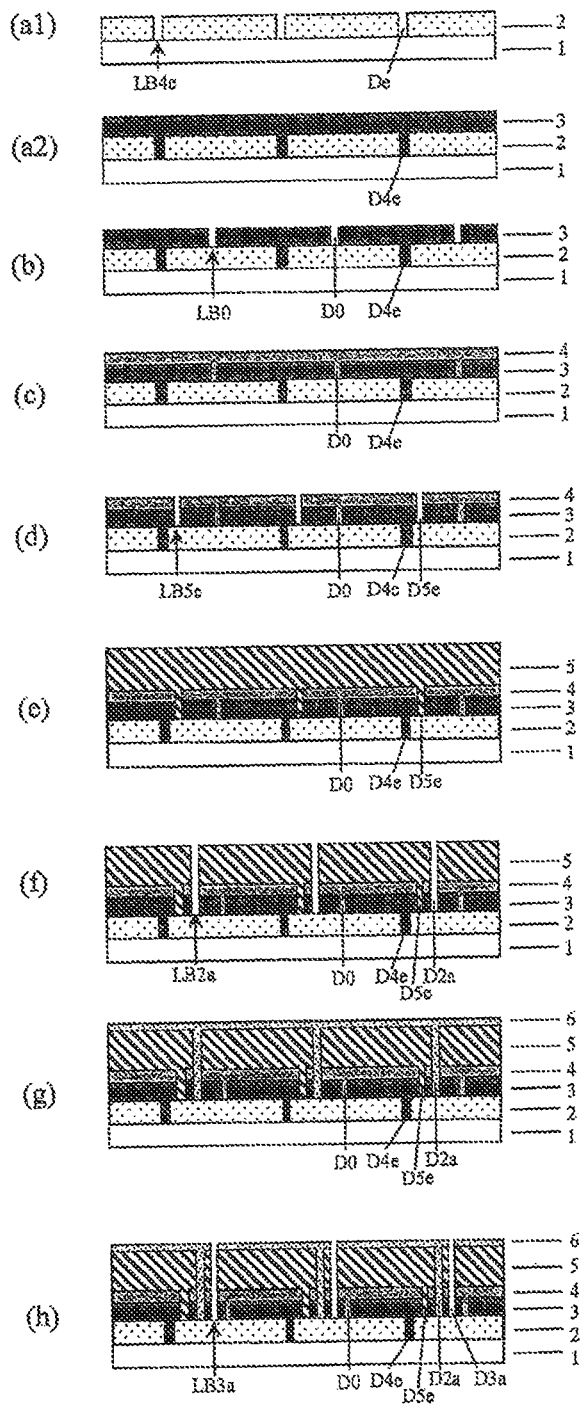
FIG. 11 is a schematic sectional view for explaining a manufacturing process of an integrated-type thin film photoelectric converter in Embodiment 12.

(2) In place of the process of FIG. 1(*d*) in Example 2, as in FIG. 11(*d*), the vicinities of the fifth kind parting line grooves D4*e* were irradiated with a laser beam LB5*e* of the second harmonic of the Q-switched YAG laser (wavelength of 532 nm), thereby forming the sixth kind parting line grooves D5*e*. By these processes, an integrated-type thin film photoelectric converter shown in FIG. 11(*h*) was produced.

The integrated-type thin film photoelectric converters obtained in Examples 2 to 12 were connected with leads, and photoelectric conversion characteristics were measured in a similar manner as in the case of Example 1. Results thereof are shown in Table 1.

Examples Regarding Embodiment 2B

Example 13

In Example 13 of the present invention, an integrated-type thin film photoelectric converter was produced in accordance with FIG. 3. First, in FIG. 3(*a*), the transparent conductive layer 2 of tin oxide was deposited on the transparent glass substrate 1. The transparent conductive layer 2 was deposited to have a thickness of about 800 nm by thermal CVD method. The transparent conductive layer 2 as thus deposited has a surface texture structure including fine unevenness. This surface texture structure influences the surface of the metal layer in the back electrode layer 4 which is to be deposited later. The fine surface roughness on the metal layer surface can generate diffuse reflection of light to function for enhancing light absorption efficiency inside the semiconductor photoelectric conversion layer 5.

Subsequently, irradiation with the infrared laser beam LB4 of the fundamental wave of the Q-switched YAG laser (wavelength of 1064 nm) was performed from the transparent glass substrate 1 side to process the transparent conductive layer 2 for formation of the parting line grooves D4.

In FIG. 3(*b*), the laser light absorption layer 3 was deposited so as to cover the parted transparent conductive layer 2 and the parting line grooves D4. This laser light absorption layer 3 includes an n-type a-Si layer with a thickness of about 20 nm, an i-type a-Si layer with a thickness of about 400 nm and a p-type a-Si layer with a thickness of about 15 nm, sequentially deposited by plasma CVD. In other words, the laser light absorption layer 3 in the present example includes a diode made up of a pin junction. It is to be noted that the laser light absorption layer 3 may have a thickness large enough to enable later performance of all laser beam processing and the pn junction or the pin junction having rectifying characteristics, and the laser light absorption layer 3 can have a thickness selected as appropriate based upon this premise.

Then, irradiation with the laser beam LB0 of the second harmonic of the Q-switched YAG laser (wavelength of 532 nm) was performed from the transparent glass substrate 1 side to process the laser light absorption layer 3 for formation of the parting line grooves D0. The laser beam LB0 used here may serve for parting processing on the laser light absorption layer 3 without damaging the transparent conductive layer 2.

In FIG. 3(*c*), the back electrode layer 4 was deposited so as to cover the parted laser light absorption layer 3 and the parting line grooves D0. As the back electrode layer 4, a zinc oxide layer having a thickness of 90 nm as a first transparent electrode layer, a silver layer having a thickness of 200 nm as a metal layer and a zinc oxide layer having a thickness of 90 nm as a second transparent electrode layer were sequentially disposed by sputtering method. The zinc oxide layer included in the back electrode layer 4 is preferred for improving adhesive strength between the silver layer and the laser light absorption layer 3 as well as the semiconductor photoelectric conversion layer 5 to be deposited later, and enhancing a reflectance of silver.

In FIG. 3(d), irradiation with the laser beam LB5 of the second harmonic of the Q-switched YAG laser (wavelength of 532 nm) was performed from the transparent glass substrate 1 side, and the laser light absorption layer 3 and the back electrode layer 4 were processed to form the parting line grooves D5. The laser beam LB5 was absorbed into the laser light absorption layer 3 to generate heat, and thereby the laser light absorption layer 3 and the back electrode layer 4 can be simultaneously subjected to parting processing with relative ease.

In FIG. 3(e), the semiconductor photoelectric conversion layer 5 was deposited by a plasma CVD method so as to cover the parted back electrode layer 4 and the parting line grooves D5. The semiconductor photoelectric conversion layer 5 is a tandem type including: a bottom photoelectric conversion unit including an n-type microcrystalline Si layer with a thickness of about 20 nm, an i-type microcrystalline silicon photoelectric conversion layer with a thickness of about 2 μm and a p-type microcrystalline Si layer with a thickness of about 15 nm, which are sequentially deposited; and an top photoelectric conversion unit including an n-type microcrystalline Si layer with a thickness of about 20 nm, an i-type a-Si:H (a-Si including H) layer with a thickness of about 300 nm and a p-type a-SiC:H (a-SiC including H) layer with a thickness of about 15 nm.

In FIG. 3(f), irradiation with the laser beam LB2a of the second harmonic of the Q-switched YAG laser (wavelength of 532 nm) was performed from the transparent glass substrate 1 side to form the parting line grooves D2a. As described above, since the laser beam LB2a of the second harmonic of the YAG laser (wavelength of 532 nm) is efficiently absorbed by the laser light absorption layer 3 and the semiconductor photoelectric conversion layer 5 to generate heat, those layers and the back electrode layer 4 can be simultaneously subjected to parting processing with relative ease.

In FIG. 3(g), the light receiving side transparent electrode layer 6 of indium oxide was deposited to have a thickness of about 80 nm by electron beam evaporation so as to cover the parted semiconductor photoelectric conversion layer 5 and the parting line grooves D2a.

In FIG. 3(h), irradiation with the laser beam LB3a of the second harmonic of the Q-switched YAG laser (wavelength of 532 nm) was performed from the transparent glass substrate 1 to form the parting line grooves D3a. As described above, since the laser beam LB3a of the second harmonic of the YAG laser (wavelength of 532 nm) is efficiently absorbed by the laser light absorption layer 3 and the semiconductor photoelectric conversion layer 5 to generate heat, along with those layers, the back electrode layer 4 and the light receiving side transparent electrode layer 6 can also be simultaneously subjected to parting processing with relative ease.

Figure 5:
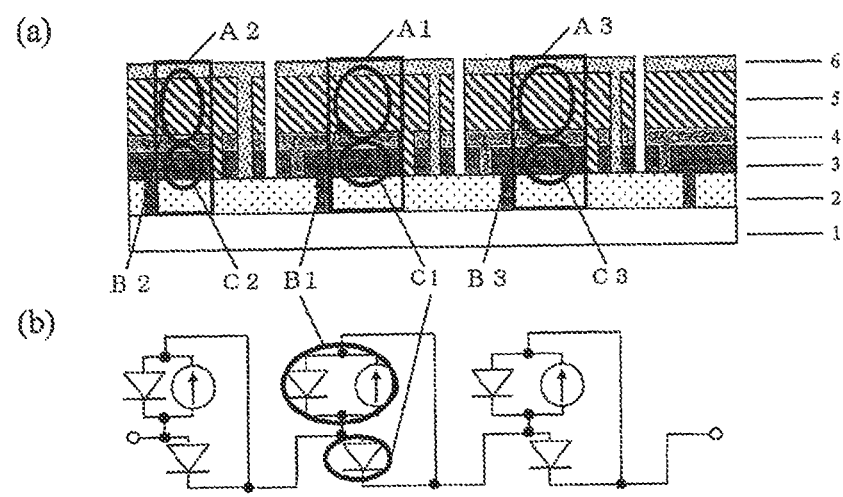
FIG. 5 is a schematic sectional view (a) of the integrated-type thin film photoelectric converter according to Embodiment 2B of the present invention, and its equivalent circuit (b).

In present Example 13, the obtained integrated-type thin film photoelectric converter is equivalent to the one shown in FIG. 5. Specifically, as shown in FIG. 5, the bypass diode region C is parallelly connected as a bypass diode to the photoelectric conversion function region B in each of the plurality of photoelectric conversion cell regions A by the processes of FIGS. 3(a) to 3(h).

Example 14

Although an integrated-type thin film photoelectric converter having bypass diode regions according to Example 14 of the present invention was also produced by the process illustrated in FIG. 3 as in Example 13, it was different as compared with Example 13 in (1) and (2) below.

(1) In FIG. 3(b), the laser light absorption layer 3 was configured such that the p-type a-Si layer with a thickness of about 15 nm, the i-type a-Si layer with a thickness of about 400 nm and the n-type a-Si layer with a thickness of about 20 nm were deposited sequentially from the transparent conductive layer 2 side. In other words, the rectifying characteristic of the laser light absorption layer is reverse to that in Example 13.

In FIG. 3(e), the semiconductor photoelectric conversion layer 5 was configured to be a tandem type including: the bottom photoelectric conversion unit having the p-type microcrystalline Si layer with a thickness of about 15 nm, the i-type microcrystalline silicon photoelectric conversion layer with a thickness of about 2 μm and the n-type microcrystalline Si layer with a thickness of about 20 nm in this order from the back electrode layer 4 side; and the top photoelectric conversion unit having the p-type a-SiC:H (a-SiC including H) layer with a thickness of about 15 nm, the i-type a-Si:H (a-Si including H) layer with a thickness of about 300 nm and the n-type microcrystalline Si layer with a thickness of about 20 nm in this order from the back electrode layer 4 side.

Example 15

Although an integrated-type thin film photoelectric converter having bypass diode regions according to Example 15 of the present invention was also produced by the process illustrated in FIG. 3 as in Example 13, it was different as compared with Example 13 in (1) and (2) below.

In FIG. 3(b), the laser light absorption layer 3 was configured such that the n-type a-Si layer with a thickness of about 40 nm and the p-type a-Si layer with a thickness of about 15 nm were deposited sequentially from the transparent conductive layer 2 side. In other words, it was configured to have no i-type layer of the laser light absorption layer 3 as compared with Example 13.

The integrated-type thin film photoelectric converters obtained in present Examples 13 to 15 were connected with leads, and photoelectric conversion characteristics were measured in a similar manner as in the case of Example 1. Results thereof are shown in Table 1.

Comparative Example 1

Figure 6:
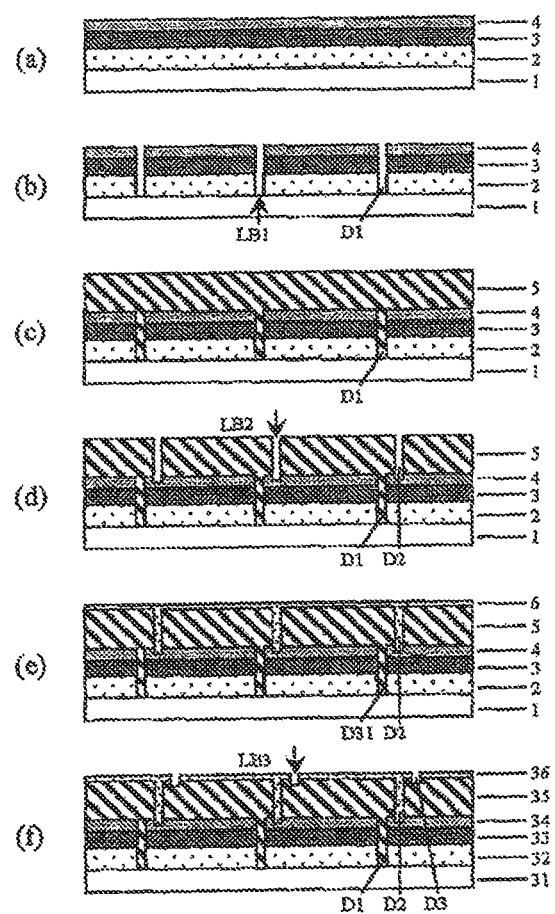
FIG. 6 is a schematic sectional view for explaining a manufacturing process of a conventional integrated-type thin film photoelectric converter.

As Comparative Example 1 for comparison with the foregoing variety of Examples, an integrated-type thin film photoelectric converter was produced in accordance with FIG. 6.

First, in FIG. 6(a), the transparent tin oxide layer 2, the laser light absorption layer 3 having a thickness of 200 nm and the back electrode layer 4 were deposited on transparent glass substrate 1 under the same condition as in the case of Example 1.

In FIG. 6(b), irradiation with the laser beam LB1 was performed to form the parting line grooves D1 under the same condition as in the process of FIG. 1(d) in the case of Example 1.

In FIG. 6(c), the semiconductor photoelectric conversion layer 5 was deposited so as to cover the parted back electrode layer 4 and the parting line grooves D1 under the same condition as in the process of FIG. 1(e) in the case of Example 1.

In FIG. 6(d), irradiation with the laser beam LB2 of the second harmonic of the Q-switched YAG laser (wavelength of 532 nm) was performed from the semiconductor photoelectric conversion layer 5 side to form the parting line grooves D2.

In FIG. 6(e), the light receiving side transparent electrode layer 6 was deposited so as to cover the parted semiconductor photoelectric conversion layer 5 and the parting line grooves D2 under the same condition as in the process of FIG. 1(g) in the case of Example 1.

In FIG. 6(f), irradiation with the laser beam LB3 of the second harmonic of the Q-switched YAG laser (wavelength of 532 nm) was performed from the light receiving side transparent substrate layer 6 side to form the parting line grooves D3.

Comparative Example 2

Although an integrated-type thin film photoelectric converter was produced in accordance with FIG. 6 as in Comparative Example 1, it was changed as compared with Comparative Example 1 in only the following respects (1) and (2).

(1) In the process of FIG. 6(a), the thickness of the laser light absorption layer 3 was not 200 nm but increased to 400 nm.

(2) In the process of FIG. 1(c), the semiconductor photoelectric conversion layer 5 was changed to a tandem type including: a bottom photoelectric conversion unit including a lower nip junction and top photoelectric conversion unit including an upper nip junction. As this bottom photoelectric conversion unit, an n-type microcrystalline Si layer with a thickness of about 20 nm, an i-type microcrystalline silicon photoelectric conversion layer with a thickness of about 2 μm and a p-type microcrystalline Si layer with a thickness of about 15 nm were sequentially deposited. On the other hand, the top photoelectric conversion unit was formed under the same condition as in the photoelectric conversion unit in Comparative Example 1.

The integrated-type thin film photoelectric converters obtained in Comparative Examples 1 and 2 were connected with leads, and photoelectric conversion characteristics were measured similarly to the case of Example 1. Results thereof are shown in Table 1.

TABLE 1

| | Short-circuit current density (mA/cm$^2$) | Open circuit voltage (V) | Fill factor | Photoelectric conversion efficiency (%) |
|---|---|---|---|---|
| Example 1 | 16.21 | 0.891 | 0.727 | 10.5 |
| Example 2 | 12.19 | 1.402 | 0.732 | 12.5 |
| Example 3 | 11.99 | 1.401 | 0.756 | 12.7 |
| Example 4 | 12.16 | 1.404 | 0.732 | 12.5 |
| Example 5 | 12.21 | 1.400 | 0.731 | 12.5 |
| Example 6 | 12.20 | 1.403 | 0.745 | 12.8 |
| Example 7 | 12.24 | 1.400 | 0.748 | 12.8 |
| Example 8 | 12.19 | 1.406 | 0.744 | 12.8 |
| Example 9 | 12.23 | 1.404 | 0.746 | 12.8 |
| Example 10 | 12.22 | 1.403 | 0.747 | 12.8 |
| Example 11 | 12.02 | 1.407 | 0.766 | 13.0 |
| Example 12 | 12.20 | 1.406 | 0.745 | 12.8 |
| Example 13 | 12.22 | 1.402 | 0.746 | 12.8 |
| Example 14 | 11.80 | 1.379 | 0.737 | 12.0 |
| Example 15 | 12.23 | 1.401 | 0.748 | 12.8 |
| Comparative Example 1 | 16.13 | 0.882 | 0.717 | 10.2 |
| Comparative Example 2 | 12.13 | 1.392 | 0.710 | 12.0 |

[Comparison of Photoelectric Conversion Characteristics]

As apparent from Table 1, when Comparative Example 1 and Example 1, each including the single photoelectric conversion unit, are compared, it is found that the integrated-type thin film photoelectric converter of the present invention is superior in any of the photoelectric conversion characteristics. Further, when Comparative Example 2 and Examples 2 to 13 and 15, each including the tandem type photoelectric conversion unit with the configuration of light being incident from the p-type layer side, are compared, it is found that the integrated-type thin film photoelectric converter of these examples are superior in photoelectric conversion efficiency to the integrated-type thin film photoelectric converter of Comparative Example 2. Moreover, it is found that even the photoelectric convertor of Example 14 having the configuration of light being incident from the n-type layer side, which usually makes the photoelectric conversion efficiency smaller, shows a similar photoelectric conversion efficiency to that of the photoelectric converter of Comparative Example 2 having the configuration of light being incident from the p-type layer side.

When Example 2 and Example 4 are compared, any of the photoelectric conversion characteristics are almost equivalent between these. And thus, it is found that the transparent conductive layer 2 can be parted to form the parting line grooves D1 even when the second harmonic of the Q-switched YAG laser (wavelength of 532 nm), which pass through the transparent conductive layer 2 without being absorbed thereinto, was used as long as it has a sufficiently high power density.

When Example 2 and Examples 6 to 12 are compared, the integrated-type thin film photoelectric converters of Examples 6 to 12 are superior to the photoelectric converter of Example 2 in the fill factor and the photoelectric conversion efficiency. This is assumed to be because the second kind parting line grooves D1 are formed at once by one kind of laser beams (fundamental wave of the YAG laser) in Example 2, whereas the fifth kind parting line grooves D4 and the sixth kind parting line grooves D5 are formed by use of by different laser beams in Examples 6 to 12, so that degradation in the peripheries of the parting line grooves D1 may be reduced.

When Example 7 and Example 10 are compared, any of the photoelectric conversion characteristics are almost equivalent between these. And thus, it is found that the transparent conductive layer 2 can be parted to form the parting line grooves D1 when even the second harmonic of the Q-switched YAG laser (wavelength of 532 nm), which passes through the transparent conductive layer 2 without being absorbed thereinto, was used as long as it has a sufficiently high power density.

When Example 14 and Examples 13 and 15 are compared, the integrated-type thin film photoelectric converters of Examples 13 and 15, each having the configuration of light being incident into the photoelectric conversion cell from the p-type layer side, are superior in each photoelectric conversion performance to the integrated-type thin film photoelectric converter of Example 14 having the configuration of light being incident into the photoelectric conversion cell from the n-type layer side.

[Hot Spot Test]

A hot spot test was performed on the integrated-type thin film photoelectric converters obtained in Examples 12 to 15. As for the hot spot test, a black vinyl tape was stuck onto one cell in a module for light shielding, and the module was set such that an incident angle of sunlight on a glass substrate surface of the module being not smaller than 80 degrees at the time of an irradiance being 80 to 100 mW/cm$^2$ (0.8 to 1 SUN)

in outdoor measurement with a pyranometer, and was then left standing for one minute. Such a hot spot test was performed on one module ten times while the cell to be light-shielded was changed. Subsequently observed was generation or non-generation of a point at which a nearly black color in the appearance of the cell surface when viewed from the glass substrate side had been changed to grey or white. It is to be noted that an air temperature at the time of the hot spot test was 15 to 30° C.

As a result of this hot spot test, in the integrated-type thin film photoelectric converter of Example 12, a point at which the color in the appearance of the cell surface had been changed to grey or white was observed. As opposed to this, in the integrated-type thin film photoelectric converters in Examples 13 to 16, the point at which the color in the appearance of the cell surface had been changed to grey or white was not observed.

Further, photoelectric conversion characteristics of each of the integrated-type thin film photoelectric converters after the hot spot test were measured again in a similar manner to the case of Example 1. The photoelectric conversion characteristics before and after the hot spot test are shown in Table 2.

TABLE 2

| | | Short-circuit current density (mA/cm$^2$) | Open circuit voltage (V) | Fill factor | Photoelectric conversion efficiency (%) |
|---|---|---|---|---|---|
| Example 12 | Before test | 12.20 | 1.406 | 0.745 | 12.8 |
| | After test | 12.19 | 1.236 | 0.542 | 8.2 |
| Example 13 | Before test | 12.22 | 1.402 | 0.746 | 12.8 |
| | After test | 12.21 | 1.402 | 0.744 | 12.8 |
| Example 14 | Before test | 11.80 | 1.379 | 0.737 | 12.0 |
| | After test | 11.78 | 1.379 | 0.736 | 12.0 |
| Example 15 | Before test | 12.23 | 1.401 | 0.748 | 12.8 |
| | After test | 12.21 | 1.401 | 0.747 | 12.8 |

When Example 12 and Example 13 are compared, it is seen that the integrated-type thin film photoelectric converter of Example 12 has the semiconductor photoelectric conversion layer 5 with the same configuration as that of the integrated-type thin film photoelectric converter of Example 13, and before the hot spot test, the integrated-type thin film photoelectric converter of Example 12 has an almost equivalent characteristics to that of Example 13 in any of the photoelectric conversion characteristics. On the other hand, the integrated-type thin film photoelectric converter of Example 13 according to Embodiment 2B of the present invention has the bypass diode function, and hence, even after the hot spot test, a point at which the color in the appearance of the cell surface had been changed to grey or white was not observed, and further photoelectric conversion characteristics of the converter were maintained high. In addition, the same as the integrated-type thin film photoelectric converter of Example 13 can apply to those of Examples 14 and 15.

INDUSTRIAL APPLICABILITY

As described above, according to the present invention, an integrated-type thin film photoelectric converter can be obtained by laser beam processing without damaging a back electrode layer, and its photoelectric conversion characteristics can be significantly improved. Further, according to the present invention, only beam irradiation from a substrate side is performed in laser beam processing, also whereby an integrated-type thin film photoelectric converter with its processing accuracy and conversion characteristics improved can be obtained with high productivity at low cost. In addition, according to the present invention, with the laser light absorption layer having the diode function, an integrated-type thin film photoelectric converter with high reliability for a hot spot phenomenon can be obtained at low cost.

The invention claimed is:

1. An integrated-type thin film photoelectric converter for photoelectrically converting incident light from a light receiving side, comprising:
   a transparent conductive layer, a laser light absorption layer, a back electrode layer, a semiconductor photoelectric conversion layer, and a light receiving side transparent electrode layer, sequentially stacked in this order on a transparent substrate, such that the light receiving side transparent electrode layer is positioned on the light receiving side of the photoelectric converter, wherein
   the transparent conductive layer, the laser light absorption layer, the back electrode layer, the semiconductor photoelectric conversion layer, and the light receiving side transparent electrode layer are parted into a plurality of strip photoelectric conversion cell regions, and those plurality of strip photoelectric conversion cell regions are electrically connected in series,
   the laser light absorption layer is parted into a plurality of strip regions by a plurality of first kind parting line grooves that penetrate only the laser light absorption layer and do not penetrate the back electrode layer,
   the back electrode layer includes a light reflecting metal layer, and the back electrode layer is parted into a plurality of strip back electrode regions by a plurality of second kind parting line grooves, wherein the second kind parting line grooves are parallel to the first kind parting line grooves and penetrate the transparent conductive layer, the laser light absorption layer and the back electrode layer,
   the semiconductor photoelectric conversion layer is parted into a plurality of strip photoelectric conversion regions by a plurality of third kind parting line grooves, wherein the third kind parting line grooves are parallel to the first kind parting line grooves and penetrate the laser light absorption layer, the back electrode layer and the semiconductor photoelectric conversion layer,
   the light receiving side transparent electrode layer is parted into a plurality of strip light receiving side transparent electrode regions by a plurality of fourth kind parting line grooves, wherein the fourth kind parting line grooves are parallel to the first kind parting line grooves and penetrate the laser light absorption layer, the back electrode layer, the semiconductor photoelectric conversion layer and the light receiving side transparent electrode layer, and
   between the mutually adjacent photoelectric conversion cells, the back electrode region of one cell is electrically connected to the light receiving side transparent electrode region of another cell through one of the first kind parting line grooves, the transparent conductive layer and one of the third kind parting line grooves, whereby those photoelectric conversion cells are electrically connected in series.

2. An integrated-type thin film photoelectric converter for photoelectrically converting incident light from a light receiving side, comprising: a transparent conductive layer, a laser light absorption layer, a back electrode layer, a semiconductor photoelectric conversion layer, and a light receiving side transparent electrode layer, sequentially stacked in this order on a transparent substrate, such that the light receiving side transparent electrode layer is positioned on the light receiving side of the photoelectric converter, wherein the transparent conductive layer, the laser light absorption layer, the back electrode layer, the semiconductor photoelectric conversion layer, and the light receiving side transparent electrode layer are parted into a plurality of strip photoelectric conversion cell regions, and those plurality of strip photoelectric conversion cell regions are electrically connected in series, the transparent conductive layer is parted into a plurality of strip light receiving side transparent conductive regions by a plurality of fifth kind parting line grooves, wherein the fifth kind parting line grooves penetrate the transparent conductive layer, the laser light absorption layer is parted into a plurality of strip laser light absorption regions by a plurality of first kind parting line grooves, wherein the first kind parting line grooves are parallel to the fifth kind parting line grooves and penetrate only the laser light absorption layer and do not penetrate the back electrode layer, the back electrode layer includes a light reflecting metal layer, and the back electrode layer is parted into a plurality of strip back electrode regions by a plurality of sixth kind parting line grooves, wherein the sixth kind parting line grooves are parallel to the first kind parting line grooves and penetrate the laser light absorption layer and the back electrode layer, the semiconductor photoelectric conversion layer is parted into a plurality of strip photoelectric conversion regions by a plurality of third kind parting line grooves, wherein the third kind parting line grooves are parallel to the first kind parting line grooves and penetrate the laser light absorption layer, the back electrode layer and the semiconductor photoelectric conversion layer, the light receiving side transparent electrode layer is parted into a plurality of strip light receiving side transparent electrode regions by a plurality of fourth kind parting line grooves, wherein the fourth kind parting line grooves are parallel to the first kind parting line grooves, and penetrate the laser light absorption layer, the back electrode layer, the semiconductor photoelectric conversion layer and the light receiving side transparent electrode layer, and between the mutually adjacent photoelectric conversion cells, a back electrode region of one cell is electrically connected to a light receiving side transparent electrode region of another cell through the first kind parting line grooves, the transparent conductive layer and the third kind parting line grooves, whereby those photoelectric conversion cells are electrically connected in series.

3. The integrated-type thin film photoelectric converter according to claim 2, wherein the laser light absorption layer includes a pn junction or a pin junction of a semiconductor, the pn junction or the pin junction of the laser light absorption layer and a pin junction of the semiconductor photoelectric conversion layer are formed such that reverse type conductive layers are facing each other across the back electrode layer, each of the parting line grooves is arrayed in parallel and in an order corresponding to the sixth kind parting line grooves, the third kind parting line grooves, the fourth kind parting line grooves, the first kind parting line grooves and the fifth kind parting line grooves, a diode region connected with the transparent conductive layer, the laser light absorption layer and the back electrode layer is formed inside each photoelectric conversion cell region, and the diode region and the photoelectric conversion region inside the same photoelectric conversion cell are connected so as to be electrically in parallel and to have reverse rectifying characteristics.

4. The integrated-type thin film photoelectric converter according to claim 2, wherein the fifth kind parting line grooves and the sixth kind parting line grooves are connected, and the sixth kind parting line grooves have groove widths smaller than those of the fifth kind parting line grooves, and are formed inside the fifth kind parting line grooves.

5. The integrated-type thin film photoelectric converter according to claim 2, wherein the fifth kind parting line grooves and the sixth kind parting line grooves are connected, and the fifth kind parting line grooves have groove widths smaller than those of the sixth kind parting line grooves and are formed inside the sixth kind parting line grooves.

6. The integrated-type thin film photoelectric converter according to claim 1, further comprising grid metal electrode wires on the light receiving side transparent electrode layer, wherein the fourth kind parting line grooves also penetrate the grid metal electrode wires.

7. A method for manufacturing an integrated-type thin film photoelectric converter for photoelectrically converting incident light from a light receiving side, the integrated-type thin film photoelectric converter comprising a transparent conductive layer, a laser light absorption layer, a back electrode layer, a semiconductor photoelectric conversion layer, and a light receiving side transparent electrode layer, sequentially slacked in this order on a transparent substrate, such that the light receiving side transparent electrode layer is positioned on the light receiving side of the photoelectric converter, wherein the transparent conductive layer, the laser light absorption layer, the back electrode layer, the semiconductor photoelectric conversion layer, and the light receiving side transparent electrode layer are parted into a plurality of strip photoelectric conversion cell regions electrically connected in series, the method comprising:

parting the laser light absorption layer into a plurality of strip regions by a plurality of first kind parting line grooves that penetrate only the laser light absorption layer and do not penetrate the back electrode layer;

parting the back electrode layer into a plurality of strip back electrode regions by a plurality of second kind parting line grooves, wherein the second kind parting line grooves are parallel to the first kind parting line grooves and penetrate the transparent conductive layer, the laser light absorption layer and the back electrode layer, and wherein the back electrode layer includes a light reflecting metal layer;

parting the semiconductor photoelectric conversion layer into a plurality of strip photoelectric conversion regions by a plurality of third kind parting line grooves, wherein the third kind parting line grooves are parallel to the first kind parting line grooves and penetrate the laser light absorption layer, the back electrode layer and the semiconductor photoelectric conversion layer;

parting the light receiving side transparent electrode layer into a plurality of strip light receiving side transparent electrode regions by a plurality of fourth kind parting line grooves, wherein the fourth kind parting line grooves are parallel to the first kind parting line grooves and penetrate the laser light absorption layer, the back electrode layer, the semiconductor photoelectric conversion layer and the light receiving side transparent electrode layer, and between mutually adjacent photoelectric conversion cells, electrically connecting in series a back electrode region of one cell to a light receiving side transparent electrode region of another cell through the first kind parting line grooves, the transparent conductive layer and the third kind parting line grooves, wherein all of the parting line grooves are formed by irradiation with laser beams from the transparent substrate side.

8. The method for manufacturing an integrated-type thin film photoelectric converter according to claim 7, wherein
all of the parting line grooves are formed in a state where the transparent substrate is located above the transparent conductive layer in a vertical direction.

9. The method for manufacturing an integrated-type thin film photoelectric converter according to claim 7, wherein
the second kind parting line grooves are formed by use of two kinds of laser beams which are different in at least either wavelength or power density.

10. The method for manufacturing an integrated-type thin film photoelectric converter according to claim 7, wherein
the fifth kind parting line grooves are formed by use of a laser beam which is different from a laser beam for forming the sixth kind parting line grooves in at least either wavelength or power density.

11. The method for manufacturing an integrated-type thin film photoelectric converter according to claim 7, wherein
parting line grooves not penetrating the transparent conductive layer are formed by use of a laser beam passing through the transparent conductive layer.

12. The method for manufacturing an integrated-type thin film photoelectric converter according to claim 11, wherein
the laser light absorption layer comprises a silicon-based semiconductor, and the laser beam passing through the transparent conductive layer is a beam of a second harmonic of a YAG laser.

13. The method for manufacturing an integrated-type thin film photoelectric converter according to claim 7, wherein
the parting line grooves penetrating the transparent conductive layer are formed by use of a laser beam being absorbed into the transparent conductive layer.

14. The method for manufacturing an integrated-type thin film photoelectric converter according to claim 13, wherein
the transparent electrode layer comprises a transparent conductive oxide, and
the second kind parting line grooves are formed by use of a beam of a fundamental wave of a YAG laser.

15. The method for manufacturing an integrated-type thin film photoelectric converter, according to claim 7, wherein
the parting line grooves penetrating the transparent conductive layer and the parting line grooves not penetrating the transparent conductive layer are formed by use of laser beams with the same wavelength, and
the laser beam for forming the parting line grooves penetrating the transparent conductive layer has a higher power density than the laser beam for forming the parting line grooves not penetrating the transparent conductive layer.

16. The integrated-type thin film photoelectric converter according to claim 2, further comprising grid metal electrode wires on the light receiving side transparent electrode layer, wherein
the forth kind parting line grooves also penetrate the grid metal electrode wires.

17. A method for manufacturing an integrated-type thin film photoelectric converter for photoelectrically converting incident light from a light receiving side, the integrated-type thin film photoelectric converter comprising a transparent conductive layer, a laser light absorption layer, a back electrode layer, a semiconductor photoelectric conversion layer, and a light receiving side transparent electrode layer sequentially stacked in this order on a transparent substrate, such that the light receiving side transparent electrode layer is positioned on the light receiving side of the photoelectric converter, wherein the transparent conductive layer, the laser light absorption layer, the back electrode layer, the semiconductor photoelectric conversion layer, and the light receiving side transparent electrode layer are parted into a plurality of strip photoelectric conversion cell regions electrically connected in series, the method comprising:

parting the transparent conductive layer into a plurality of strip light receiving side transparent conductive regions by a plurality of fifth kind parting line grooves, wherein the fifth kind parting line grooves penetrate the transparent conductive layer;

parting the laser light absorption layer into a plurality of strip laser light absorption regions by a plurality of first kind parting line grooves, wherein the first kind parting line grooves are parallel to the fifth kind parting line grooves and penetrate only the laser light absorption layer and do not penetrate the back electrode layer;

parting the back electrode layer into a plurality of strip back electrode regions by a plurality of sixth kind parting line grooves, wherein the sixth kind parting line grooves are parallel to the first kind parting line grooves and penetrate the laser light absorption layer and the back electrode layer, and wherein the back electrode layer includes a light reflecting metal layer;

parting the semiconductor photoelectric conversion layer into a plurality of strip photoelectric conversion regions by a plurality of third kind parting line grooves, wherein the third kind parting line grooves are parallel to the first kind parting line grooves and penetrate the laser light absorption layer, the back electrode layer and the semiconductor photoelectric conversion layer;

parting the light receiving side transparent electrode layer into a plurality of strip light receiving side transparent electrode regions by a plurality of fourth kind parting line grooves, wherein the fourth kind parting line grooves are parallel to the first kind parting line grooves, and penetrate the laser light absorption layer, the back electrode layer, the semiconductor photoelectric conversion layer and the light receiving side transparent electrode layer, and between two mutually adjacent photoelectric conversion cells, electrically connecting in series the back electrode region of one cell to the light receiving side transparent electrode region of another cell through the first kind parting line grooves, the transparent conductive layer and the third kind parting line grooves, wherein all of the parting line grooves are formed by irradiation with laser beams from the transparent substrate side.

18. The method for manufacturing an integrated-type thin film photoelectric converter according to claim 17, wherein all of the parting line grooves are formed in a state where the transparent substrate is located above the transparent conductive layer in a vertical direction.

19. The method for manufacturing an integrated-type thin film photoelectric converter according to claim 17, wherein the second kind parting line grooves are formed by use of two kinds of laser beams which are different in at least either wavelength or power density.

20. The method for manufacturing an integrated-type thin film photoelectric converter according to claim 17, wherein the fifth kind parting line grooves are formed by use of a laser beam which is different from a laser beam for forming the sixth kind parting line grooves in at least either wavelength or power density.

21. The method for manufacturing an integrated-type thin film photoelectric converter according to claim 17, wherein parting line grooves not penetrating the transparent conductive layer are formed by use of a laser beam passing through the transparent conductive layer.

22. The method for manufacturing an integrated-type thin film photoelectric converter according to claim 21, wherein the laser light absorption layer comprises a silicon-based semiconductor, and
the laser beam passing through the transparent conductive layer is a beam of a second harmonic of a YAG laser.

23. The method for manufacturing an integrated-type thin film photoelectric converter according to claim 17, wherein the parting line grooves penetrating the transparent conductive layer are formed by use of a laser beam being absorbed into the transparent conductive layer.

24. The method for manufacturing an integrated-type thin film photoelectric converter according to claim 23, wherein the transparent electrode layer comprises a transparent conductive oxide, and
the second kind parting line grooves are formed by use of a beam of a fundamental wave of the YAG laser.

25. The method for manufacturing an integrated-type thin film photoelectric converter, according to claim 17, wherein the parting line grooves penetrating the transparent conductive layer and the parting line grooves not penetrating the transparent conductive layer are formed by use of laser beams with the same wavelength, and
the laser beam for forming the parting line grooves penetrating the transparent conductive layer has a higher power density than the laser beam for forming the parting line grooves not penetrating the transparent conductive layer.

* * * * *

UNITED STATES PATENT AND TRADEMARK OFFICE
CERTIFICATE OF CORRECTION

| | |
|---|---|
| PATENT NO. | : 9,252,306 B2 |
| APPLICATION NO. | : 12/746486 |
| DATED | : February 2, 2016 |
| INVENTOR(S) | : Masahiro Goto et al. |

It is certified that error appears in the above-identified patent and that said Letters Patent is hereby corrected as shown below:

In the claims, column 30, line 50, delete "layer:" and insert --layer;-- and;

column 32, line 34, delete "laver" and insert --layer--.

Signed and Sealed this
Third Day of May, 2016

Michelle K. Lee
*Director of the United States Patent and Trademark Office*